(12) United States Patent
Jang et al.

(10) Patent No.: US 10,474,034 B2
(45) Date of Patent: Nov. 12, 2019

(54) PHASE SHIFT MASK

(71) Applicant: SAMSUNG ELECTRONICS CO., LTD., Suwon-si, Gyeonggi-do (KR)

(72) Inventors: Il-yong Jang, Yongin-si (KR); Hyung-ho Ko, Hwaseong-si (KR); Jin-sang Yoon, Anyang-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/916,437

(22) Filed: Mar. 9, 2018

(65) Prior Publication Data

US 2018/0196348 A1 Jul. 12, 2018

Related U.S. Application Data

(62) Division of application No. 14/849,006, filed on Sep. 9, 2015, now Pat. No. 9,989,857.

(Continued)

(30) Foreign Application Priority Data

Dec. 1, 2014 (KR) .......................... 10-2014-0169976

(51) Int. Cl.
*G03F 1/32* (2012.01)
*G03F 7/22* (2006.01)
(Continued)

(52) U.S. Cl.
CPC .................. *G03F 7/22* (2013.01); *G03F 1/32* (2013.01); *G03F 1/42* (2013.01); *G03F 7/203* (2013.01)

(58) Field of Classification Search
CPC ................. G03F 1/32; G03F 1/34; G03F 1/42
(Continued)

(56) References Cited

U.S. PATENT DOCUMENTS 5,429,896 A * 7/1995 Hasegawa ................ G03F 1/26
430/311
5,429,897 A * 7/1995 Yoshioka ................ G03F 1/26
430/321

(Continued)

FOREIGN PATENT DOCUMENTS

JP 2012-145630 A 8/2012
JP 2013-148892 A 8/2013
(Continued)

OTHER PUBLICATIONS

Taiwanese Office action dated Feb. 23, 2019.

*Primary Examiner* — John A McPherson
(74) *Attorney, Agent, or Firm* — Lee & Morse, P.C.

(57) ABSTRACT

A phase shift mask includes a substrate, a second phase shift pattern on the substrate, the second phase shift pattern extending to an outermost perimeter of the substrate, the second phase shift pattern being formed of a material that is semi-transmissive to light of a first wavelength and the substrate being substantially transparent to the light of the first wavelength such that the mask transmits about 2 to about 10% of the light of the first wavelength at the second phase shift pattern, and a first phase shift pattern on the substrate, the second phase shift pattern being disposed between the outermost perimeter of the substrate and the first phase shift pattern.

9 Claims, 25 Drawing Sheets

Related U.S. Application Data

(60) Provisional application No. 62/066,046, filed on Oct. 20, 2014.

(51) Int. Cl.
  *G03F 1/42* (2012.01)
  *G03F 7/20* (2006.01)

(58) Field of Classification Search
  USPC .......................................................... 430/5
  See application file for complete search history.

(56) References Cited

U.S. PATENT DOCUMENTS

| | | |
|---|---|---|
| 5,446,521 A | 8/1995 | Hainsey et al. |
| 5,637,425 A | 6/1997 | Lee et al. |
| 5,786,114 A * | 7/1998 | Hashimoto ............... G03F 1/26 430/5 |
| 5,902,717 A | 5/1999 | Hayakawa |
| 2004/0197674 A1 | 10/2004 | Bailey et al. |
| 2005/0202323 A1 | 9/2005 | Watanabe |
| 2005/0208427 A1 | 9/2005 | Hayano et al. |
| 2006/0019176 A1 | 1/2006 | Kim et al. |

FOREIGN PATENT DOCUMENTS

| | | |
|---|---|---|
| KR | 10-1999-0070449 A | 9/1999 |
| KR | 10-2002-0040236 A | 5/2002 |
| KR | 10-2003-0089343 A | 11/2003 |
| KR | 10-2009-0029436 A | 3/2009 |
| KR | 10-2012-0054467 A | 5/2012 |
| TW | 444264 B | 7/2001 |

* cited by examiner

PHASE SHIFT MASK

CROSS-REFERENCE TO RELATED APPLICATIONS

This is a divisional application based on pending application Ser. No. 14/849,006, filed Sep. 9, 2015, the entire contents of which is hereby incorporated by reference.

The present application claims priority under 35 U.S.C. § 119(e) to U.S. Provisional Application No. 62/066,046, filed on Oct. 20, 2014, and entitled: "Photomask and Method Of Forming The Same and Methods Of Manufacturing Electronic Device And Display Device Using The Photomask," which is incorporated herein by reference in its entirety.

Korean Patent Application No. 10-2014-0169976, filed on Dec. 1, 2014, in the Korean Intellectual Property Office, and entitled: "Photomask and Method Of Forming The Same and Methods Of Manufacturing Electronic Device And Display Device Using The Photomask," is incorporated by reference herein in its entirety.

BACKGROUND

1. Field

Embodiments relate to a photomask, a method of manufacturing the photomask, a method of manufacturing an electronic device using the photomask, and a method of manufacturing a display device.

2. Description of the Related Art

In recent years, the line width of pixel transistors has gradually been reduced in manufacture of a thin-film transistor liquid crystal display (TFT LCD) in the development of a high-resolution display device.

SUMMARY

Embodiments are directed to a phase shift mask, including a substrate, a second phase shift pattern on the substrate, the second phase shift pattern extending to an outermost perimeter of the substrate, the second phase shift pattern being formed of a material that is semi-transmissive to light of a first wavelength and the substrate being substantially transparent to the light of the first wavelength such that the mask transmits about 2 to about 10% of the light of the first wavelength at the second phase shift pattern, and a first phase shift pattern on the substrate, the second phase shift pattern being disposed between the outermost perimeter of the substrate and the first phase shift pattern.

The second phase shift pattern may have an opening therein, the opening corresponding to an alignment key.

A minimum transmittance of the entire area of the phase shift mask may be about 2% with respect to the light of the first wavelength.

The phase shift mask may not include an opaque area.

Embodiments are also directed to a method of manufacturing a unit substrate, the method including providing a mother substrate, the mother substrate having a size sufficient to provide at least two unit substrates, aligning a phase shift mask with a first location of the mother substrate, irradiating a first region the mother substrate through the phase shift mask aligned with the first location, aligning the phase shift mask with a second location of the mother substrate such that the phase shift mask overlaps a sub-region of the irradiated first region, and irradiating a second region of the mother substrate through the phase shift mask aligned with the second location such that the sub-region is irradiated for a second time.

The phase shift mask may include a substrate, a second phase shift pattern on the substrate, the second phase shift pattern extending to an outermost perimeter of the substrate, the second phase shift pattern being formed of a material that is semi-transmissive to light of a first wavelength and the substrate being substantially transparent to the light of the first wavelength such that the mask transmits about 2 to about 10% of the light of the first wavelength at the second phase shift pattern, and a first phase shift pattern on the substrate, the second phase shift pattern being disposed between the outermost perimeter of the substrate and the phase shift pattern, the first phase shift pattern inducing interference when light of the first wavelength is irradiated through the first phase shift pattern.

The phase shift mask may include a substrate, and a phase shift layer on the substrate, wherein an edge portion of the phase shift mask is a semitransparent region.

The sub-region may be irradiated through the semitransparent region of the phase shift mask.

The semitransparent region may have an opening therein, the opening corresponding to an alignment key.

An alignment key, corresponding to the opening, may be formed in the sub-region.

The mother substrate may be a silicon wafer or a mother display panel substrate.

The method may further include, after irradiating the second region, separating the mother substrate into at least two unit substrates, wherein the sub-region is in a lane between adjacent unit substrates.

Embodiments are also directed to a semiconductor device fabricated according to a method according to an embodiment.

Embodiments are also directed to a display panel fabricated according to a method according to an embodiment.

Embodiments are also directed to a phase shift mask, including a substrate, and a phase shift layer on the substrate, wherein an edge portion of the phase shift mask is a semitransparent region.

The semitransparent region may transmit about 2 to 10% of light.

The phase shift layer may include one or more of chromium oxide or molybdenum silicide.

The phase shift mask may not include an opaque layer at the edge portion, the edge portion being an outer edge of the phase shift mask.

The phase shift mask may include a main pattern region, the main pattern region having substantially the same thickness as the semitransparent region.

The semitransparent region may be disposed between the main pattern region and an outermost edge of the phase shift mask.

Embodiments are also directed to a photomask, including a transparent substrate, a main pattern region formed on a central portion of the transparent substrate, and a semitransparent edge region that extends from an outer portion of the main pattern region to an outer portion of the transparent substrate on the transparent substrate.

The main pattern region may include at least one main pattern including a first phase shift pattern, and he semitransparent edge region may include a second phase shift pattern that extends from the outer portion of the main pattern region to the outer portion of the transparent substrate.

The second phase shift pattern may have a bottom surface, which is in contact with the transparent substrate, and an exposed top surface.

The first phase shift pattern and the second phase shift pattern may be formed of a same material.

The first phase shift pattern may have a same thickness as the second phase shift pattern.

The first phase shift pattern may have a same light transmittance as the second phase shift pattern.

Each of the first phase shift pattern and the second phase shift pattern may have a light transmittance of about 2% to 10% with respect to exposure light used to expose the photomask.

Each of the first phase shift pattern and the second phase shift pattern may have a phase shift amount of 180±5 degrees with respect to exposure light used to expose the photomask.

Each of the first phase shift pattern and the second phase shift pattern may be formed of a chromium (Cr) compound, a silicon (Si) compound, a metal silicide compound, or a combination thereof.

The first phase shift pattern may include a pattern for transferring a pattern, which is used to form an electronic device using a photolithography process, to a device forming region of a substrate for forming the electronic device, and the second phase shift pattern may include at least one auxiliary pattern for transferring an alignment key, which is used to perform the photolithography process, to a region of the substrate for forming the electronic device, except the device forming region.

Embodiments are also directed to a photomask, including a main pattern region that is formed in a central portion of a transparent substrate and includes at least one main pattern, and a semi-transparent edge region that extends from an outer portion of the main pattern region to an outer portion of the transparent substrate. The semi-transparent edge region may have a double-layer structure including an edge portion of the transparent substrate and a semi-transparent layer formed on the edge portion.

The at least one main pattern may be formed of a same material as the semi-transparent layer.

The at least one main pattern may include a first phase shift pattern, the semi-transparent layer may include a second phase shift pattern, and each of the first phase shift pattern and the second phase shift pattern may have a light transmittance of about 2% to about 10% with respect to exposure light used to expose the photomask.

The first phase shift pattern may have a same thickness as the second phase shift pattern.

Embodiments are also directed to a method of manufacturing a photomask, the method including forming a phase shift layer on a transparent substrate to cover a central portion of the transparent substrate and an edge portion of the transparent substrate surrounding the central portion, forming a mask pattern on the phase shift layer, etching the phase shift layer using the mask pattern as an etch mask to form at least one main pattern and a semi-transparent pattern, wherein the at least one main pattern includes a first portion of the phase shift layer, which remains on the central portion, and the semi-transparent pattern includes a second portion of the phase shift layer, which remains on the edge portion, and removing the mask pattern to expose a top surface of the at least one main pattern and a top surface of the semi-transparent pattern.

The phase shift layer may include a layer having a light transmittance of about 2% to about 10% with respect to exposure light used to expose the photomask.

The phase shift layer may be formed to a same thickness on both the central portion and the edge portion.

Embodiments are also directed to a method of manufacturing an electronic device, the method including preparing a photomask including a transparent substrate, a main pattern region, and a semi-transparent edge region, wherein the main pattern region is formed on a central portion of the transparent substrate and includes at least one main pattern, and the semi-transparent region extends from an outer portion of the main pattern region to an outer portion of the transparent substrate, forming a photoresist layer on a workpiece including a plurality of device regions and a peripheral region defining the plurality of device regions, and duplicatively exposing at least a portion of the peripheral region using the photomask while exposing the workpiece on which the photoresist layer is formed, a plurality of times in an exposure system.

The exposing of the workpiece the plurality of times may include exposing a first device region of the plurality of device regions through the main pattern region of the photomask to transfer the at least one main pattern to the photoresist layer formed on the first device region and simultaneously, firstly exposing a first peripheral region of the peripheral region, which is formed around the first device region, through the semi-transparent edge region of the photomask, and exposing a second device region of the plurality of device regions, which is formed adjacent to the first device region, through the main pattern region of the photomask to transfer the at least one main pattern to the photoresist layer formed on the second device region and simultaneously, secondly exposing a first local region of the first peripheral region, which is interposed between the first device region and the second device region, through the semi-transparent edge region of the photomask.

The firstly exposing of the first peripheral region may include transferring an image of an alignment key to the first peripheral region.

The secondly exposing of the first local region may include transferring the image of the alignment key to the first local region.

The method may further include, after the secondly exposing of the first local region, exposing a third device region of the plurality of device regions, which is formed adjacent to the second device region, through the main pattern region of the photomask to transfer the at least one main pattern to the photoresist layer formed on the third device region and simultaneously, thirdly exposing a second local region, which is a portion of the first local region, through the semi-transparent edge region of the photomask.

The method may further include, after the thirdly exposing of the second local region, exposing a fourth device region of the plurality of device regions, which is formed adjacent to the third device region, through the main pattern region of the photomask to transfer the at least one main pattern to the photoresist layer formed on the fourth device region and simultaneously, fourthly exposing the second local region through the semi-transparent edge region of the photomask.

At least one of the firstly exposing of the first peripheral region, the secondly exposing of the first local region, and the thirdly exposing of the second local region may include transferring an image of an alignment key to the first peripheral region, and in the fourthly exposing of the second local region, the second local region may include a region to which the image of the alignment key is transferred before the fourthly exposing of the second local region is performed.

The semi-transparent edge region of the photomask may include an auxiliary pattern for forming an alignment key, and the method may further include developing the exposed photoresist layer to form a pattern corresponding to the at least one main pattern in each of the plurality of device regions and form at least one alignment key in the peripheral region after the exposing of the workpiece the plurality of times.

The exposing of the workpiece the plurality of times may be performed by using a light source, and the semi-transparent edge region may include a phase shift pattern having a light transmittance of about 2% to about 10% with respect to exposure light emitted by the light source.

Embodiments are also directed to a method of manufacturing a display device, the method including preparing a photomask including a transparent substrate, a main pattern region, and a semi-transparent region, wherein the main pattern region is formed on a central portion of the transparent substrate and includes at least one main pattern, and the semi-transparent edge region extends from an outer portion of the main pattern region to an outer portion of the transparent substrate, preparing a panel including a plurality of device regions and a plurality of alignment key regions, wherein the plurality of device regions are separated from one another, and the plurality of alignment key regions are respectively formed around the plurality of device regions, forming a photoresist layer on the panel to cover the plurality of device regions and the plurality of alignment key regions, and duplicatively exposing at least a portion of the plurality of alignment key regions using the photomask, while sequentially exposing the plurality of device regions and the plurality of alignment key regions, which are covered with the photoresist layer, in an exposure system.

The sequentially exposing of the plurality of device regions and the plurality of alignment key regions may include a first exposure operation of exposing a first device region selected from the plurality of device regions, through the main pattern region and simultaneously, exposing a first alignment key region selected from the plurality of alignment key regions through the semi-transparent edge region, and a second exposure operation of exposing a second device region, which is selected from the plurality of device regions and adjacent to the first device region, through the main pattern region and simultaneously, exposing a first local region selected from the first alignment key region, through the semi-transparent edge region.

The sequentially exposing of the plurality of device regions and the plurality of alignment key regions may further include a third exposure operation of exposing a third device region, which is selected from the plurality of device regions and adjacent to any one of the first device region and the second device region, through the main pattern region and simultaneously, exposing a second local region selected from the first local region, through the semi-transparent edge region.

The semi-transparent edge region may include a phase shift pattern having a light transmittance of about 2% to about 10% with respect to exposure light emitted by a light source.

The semi-transparent edge region of the photomask may include at least one auxiliary pattern for forming an alignment key, and the method may further include developing the exposed photoresist layer to form a pattern corresponding to the at least one main pattern in each of the plurality of device regions and form at least one alignment key in the plurality of alignment key regions after the sequentially exposing of the plurality of device regions and the plurality of alignment key regions.

The at least one main pattern may have a minimum feature size of a first size, and the at least one auxiliary pattern may have a minimum feature size of about 10 times to about 300 times the first size.

The sequentially exposing of the plurality of device regions and the plurality of alignment key regions may be performed by using synthesized light emitted by i-line (365 nm), g-line (436 nm), h-line (405 nm), or a combination thereof.

The sequentially exposing of the plurality of device regions and the plurality of alignment key regions may be performed using a KrF excimer laser (248 nm) or an ArF excimer laser (193 nm).

BRIEF DESCRIPTION OF THE DRAWINGS

Features will become apparent to those of skill in the art by describing in detail example embodiments with reference to the attached drawings in which.

DETAILED DESCRIPTION

Figure 1A:
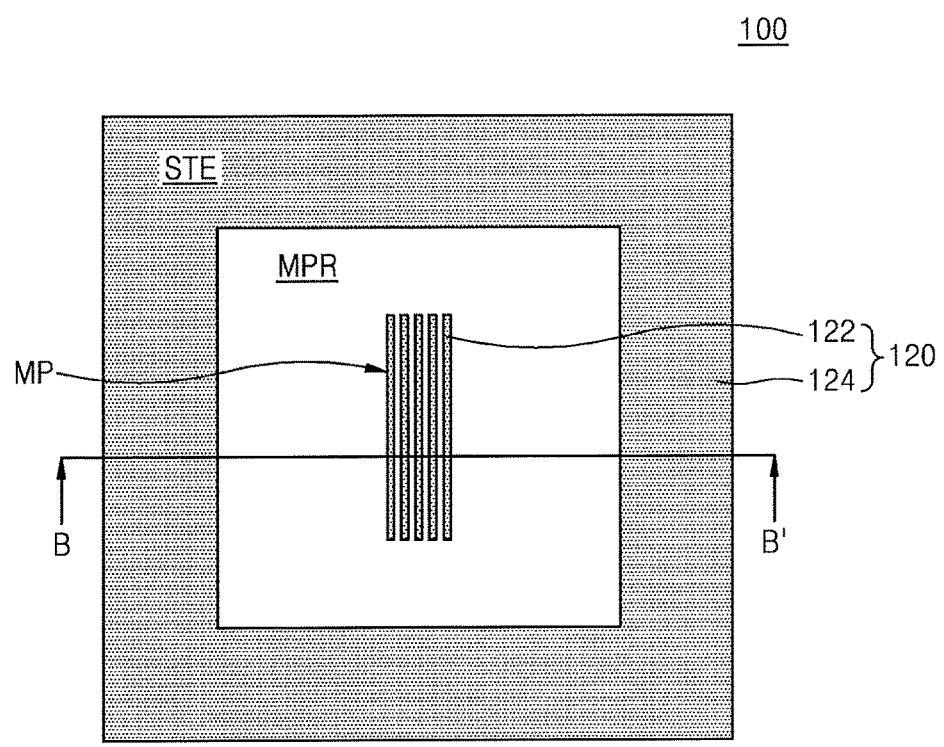
FIG. 1A illustrates a plan view of a photomask according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

When some embodiments may be embodied otherwise, respective process steps described herein may be performed otherwise. For example, two process steps described in a sequential order may be performed substantially the same time or in reverse order.

Variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. As used herein, the term "and/or" includes any and all combinations of one or more of the associated listed items.

Figure 1B:
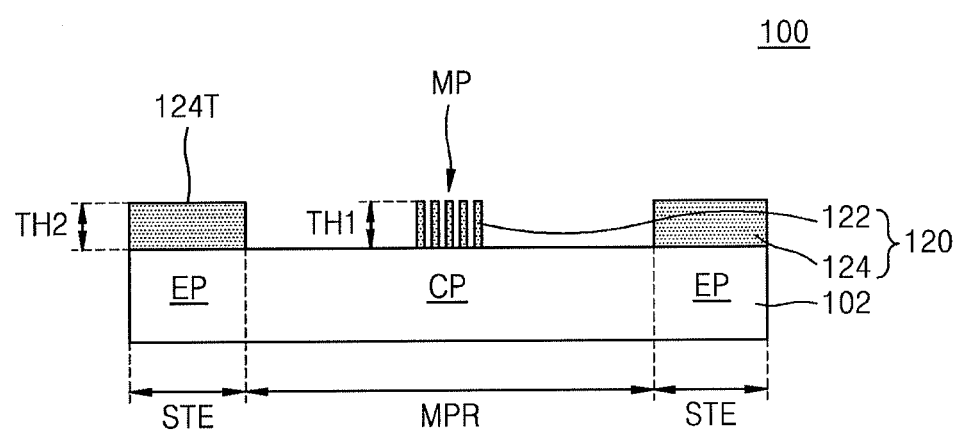
FIG. 1B illustrates a cross-sectional view taken along a line B-B' of FIG. 1A.

FIG. 1A illustrates a front-side plan view of a photomask 100 according to example embodiments, and FIG. 1B is a cross-sectional view taken along a line B-B' of FIG. 1A.

Referring to FIGS. 1A and 1B, the photomask 100 may include a transparent substrate 102, a main pattern region MPR formed on a central portion CP of the transparent substrate 102, and a semi-transparent edge region STE that is formed on the transparent substrate 102 and extends from an outer portion of the main pattern region MPR to an outer portion of the transparent substrate 102.

The photomask 100 may be provided in a single-layer phase shift mask (SL-PSM) form in which only a phase shift pattern 120 is formed on the transparent substrate 102.

At least one main pattern MP, which includes a first phase shift pattern 122 as a part of the phase shift pattern 120, may be formed in the main pattern region MPR.

A second phase shift pattern 124, which is another part of the phase shift pattern 120, may be formed in the semi-transparent edge region STE. The second phase shift pattern 124 may extend from the outer portion of the main pattern region MPR to the outer portion of the transparent substrate 102 in the semi-transparent edge region STE.

Each of the first phase shift pattern 122 and the second phase shift pattern 124 may have a bottom surface that is in contact with the transparent substrate 102.

In the photomask 100, the semi-transparent edge region STE may have a double structure, which may include only an edge portion EP of the transparent substrate 102 and the second phase shift pattern 124 that is a semi-transparent layer formed on the edge portion EP of the transparent substrate 102. The semi-transparent edge region STE may not include a light shielding layer but include only the transparent substrate 102 and the second phase shift pattern 124. The second phase shift pattern 124 may have a top surface 124T that is exposed at an opposite side of the transparent substrate 102.

In some embodiments, the transparent substrate 102 may be formed of quartz, glass, or a plastic. The plastic may be polyimide (PI), polyamide (PA), liquid crystal (LC) polyarylate, polyethylene terephthalate (PET), polyether ether ketone (PEEK), polyether sulfone (PES), polyether nitrile (PEN), polyester, polycarbonate (PC), polysulfone, or polyetherimide (PEI).

The first phase shift pattern 122 and the second phase shift pattern 124 may be formed of the same material. Each of the first phase shift pattern 122 and the second phase shift pattern 124 may be formed of a chromium (Cr) compound, a silicon (Si) compound, a metal silicide compound, or a combination thereof. The Cr compound may be one selected from the group of Cr oxide, Cr nitride, Cr carbide, Cr oxynitride, and Cr oxynitride carbide. The Si compound may be one selected from the group of Si oxide and spin on glass (SOG). The metal silicide compound may include at least one metal selected from molybdenum (Mo), titanium (Ti), tantalum (Ta), zirconium (Zr), hafnium (Hf), niobium (Nb), vanadium (V), tungsten (W), cobalt (Co), chromium (Cr), and nickel (Ni), silicon (Si), and at least one element selected from oxide (O) and nitrogen (N). In some embodiments, the metal silicide compound may be one selected from TaSi, MoSi, WSi, nitrides thereof, and oxynitrides thereof.

In some embodiments, each of the first phase shift pattern 122 and the second phase shift pattern 124 may be formed of MoSiN, MoSiCN, MoSiON, MoSiCON, TaON, TiON, or a combination thereof.

A thickness TH1 of the first phase shift pattern 122 may be equal to a thickness TH2 of the second phase shift pattern 124.

The first phase shift pattern 122 may have the same light transmittance as the second phase shift pattern 124. In some embodiments, the first phase shift pattern 122 and the second phase shift pattern 124 may have an equal light transmittance, which is selected in the range of about 2% to 10% with respect to exposure light used to expose the photomask 100. For example, each of the first phase shift pattern 122 and the second phase shift pattern 124 may have a light transmittance of about 2% to about 10% with respect to i-line (365 nm).

In some embodiments, when a display device is manufactured by performing an exposure process using the photomask 100, an exposure process may be duplicatively performed on a partial region (e.g., a cutting region) of a mother substrate for manufacturing the display device through the semi-transparent edge region STE on which the second phase shift pattern 124 is formed. For example, the cutting region may be a region in which auxiliary patterns (e.g., an alignment key or a test pattern) having a low integration density and a relatively large line width are formed. Even if the cutting region is duplicatively exposed two to four times through the semi-transparent edge region STE on which the second phase shift pattern 124 is formed, since the second phase shift pattern 124 has a relatively low light transmittance that is selected in a range of about 2% to 10% with respect to exposure light, formation of the auxiliary patterns (e.g., the alignment key) formed in the cutting region may not be adversely affected.

Each of the first phase shift pattern 122 and the second phase shift pattern 124 may have a phase shift amount of about 180±5 degrees with respect to exposure light used to expose the photomask 100.

The photomask 100 may be used in a photolithography process for manufacturing various microelectronic devices. In some embodiments, the photomask 100 may be used to manufacture high-integrated memory devices (e.g., a display device, a dynamic random access memory (DRAM), a static RAM (SRAM), and a flash memory device), processors (e.g., a central processing unit (CPU), a digital signal processor (DSP), and a combination of a CPU and a DSP), and microelectronic devices (e.g., an application specific integrated circuit (ASIC), a micro-electro-mechanical-systems (MEMS) device, and an optoelectronic device).

The at least one main pattern MP formed in the main pattern region MPR of the photomask 100 may be a pattern for transferring a pattern required to form an electronic device using a photolithography process to a device forming region of a substrate for forming the electronic device. In some embodiments, the at least one main pattern MP may include patterns for forming pixel regions, device regions, chip regions, or cell regions of the various microelectronic devices described above.

Figure 2A:
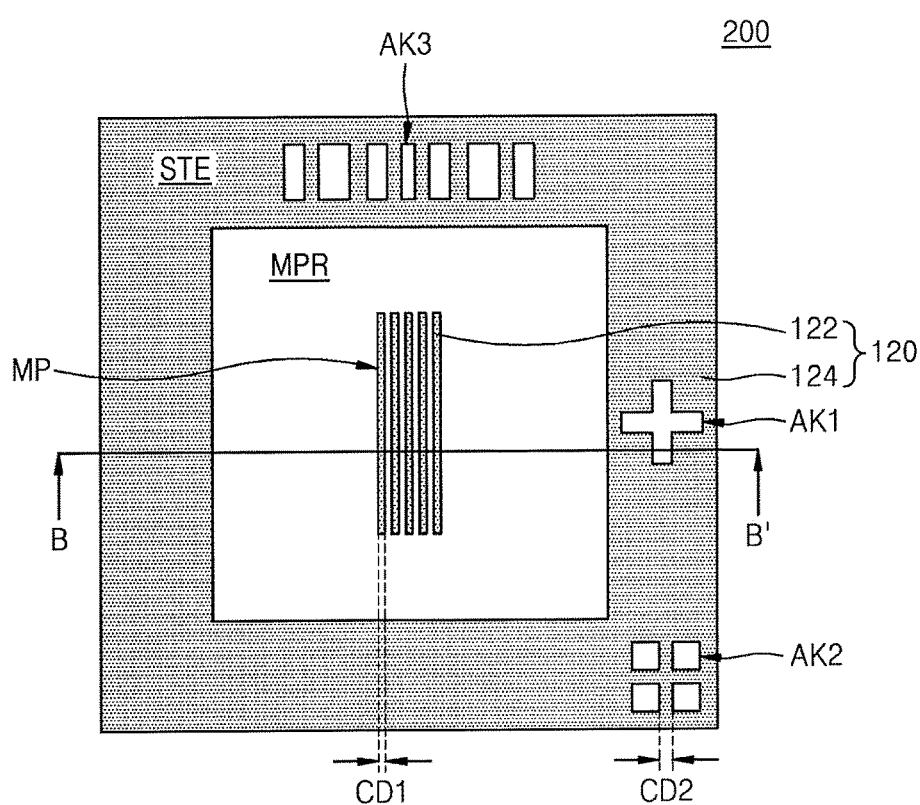
FIG. 2A illustrates a plan view of a photomask according to other example embodiments.
Figure 2B:
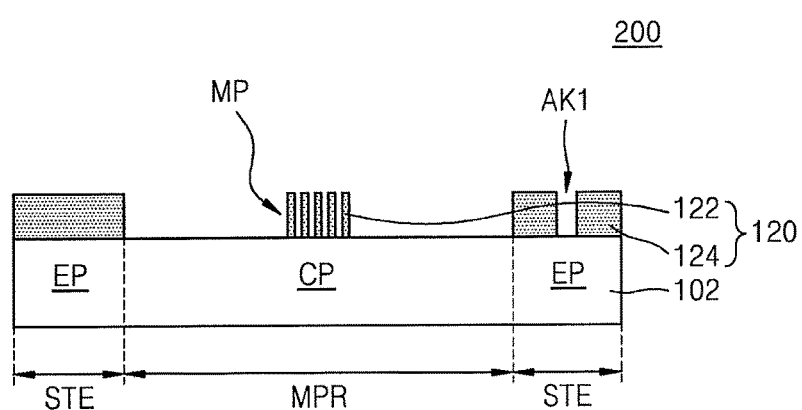
FIG. 2B illustrates a cross-sectional view taken along line B-B' of FIG. 2A.

FIGS. 2A and 2B illustrate diagrams of a photomask 200 according to other example embodiments. FIG. 2A illustrates a plan view of the photomask 200 according to other example embodiments, and FIG. 2B illustrates a cross-sectional view taken along line B-B' of FIG. 2A. In FIGS. 2A and 2B, the same reference numerals are used to denote the same elements as in FIGS. 1A and 1B, and detailed descriptions thereof are omitted.

Referring to FIGS. 2A and 2B, at least one auxiliary pattern AK1, AK2, and AK3 may be formed on a semi-transparent edge region STE of the photomask 200. The at least one auxiliary pattern may be an opening-type pattern that is formed in the second phase shift pattern 124 formed in the semi-transparent edge region STE to expose the transparent substrate 120.

When patterns for forming pixel regions, device regions, chip regions, or cell regions of microelectronic devices are formed using the at least one main pattern MP, the at least one auxiliary pattern AK1, AK2, and AK3 may include alignment keys for aligning the patterns with one another. For example, the at least one auxiliary pattern AK1, AK2, and AK3 may include various kinds of alignment keys including an alignment key for aligning layers of an electronic device to be formed, an alignment key for aligning a photomask with an exposure system, an alignment key for aligning dies in a mother substrate, and an alignment key for aligning an exposure lens with the photomask, or photomask codes.

In some embodiments, the at least one auxiliary pattern AK1, AK2, and AK3 may include a first alignment key AK1, a second alignment key AK2, and a photomask code AK3.

In some embodiments, during an exposure process using the photomask 200, the at least one auxiliary pattern, for example, each of the first alignment key AK1, the second alignment key AK2, and the photomask code AK3, may be a pattern to be transferred to a peripheral region of each of a plurality of unit device regions, which are included in the mother substrate and each of which constitutes a display panel (namely, a cutting region by which the plurality of unit device regions are separated into individual display panels).

In some other embodiments, the at least one auxiliary pattern, for example, each of the first alignment key AK1, the second alignment key AK2, and the photomask code AK3, may be a pattern for transferring an alignment key on a scribe lane disposed between a plurality of chip regions on a wafer.

The at least one main pattern MP may have a minimum feature size of a first critical dimension (CD) CD1. Also, the at least one auxiliary pattern, each of the first alignment key AK1, the second alignment key AK2, and the photomask code AK3 may have a minimum feature size of a second CD CD2, which is about 10 times to 300 times of the first CD CD1. In some embodiments, the at least one main pattern MP may have a minimum feature size of about 1 μm to about 10 μm and a minimum pitch of about 2 μm to about 30 μm. In some embodiments, the at least one auxiliary pattern, for example, each of the first alignment key AK1, the second alignment key AK2, and the photomask code AK3 may have a minimum feature size of about 10 μm to about 300 μm and a minimum pitch of about 20 μm to about 600 μm.

FIGS. 3A to 3D illustrate cross-sectional views taken along line B-B' of FIG. 1, illustrating sequential processes of a method of manufacturing a photomask according to some example embodiments. Although the present example embodiment describes the method of manufacturing the photomask 100 shown in FIGS. 1A and 1B, the method may be applied to methods of manufacturing the photomask 200 shown in FIGS. 2A and 2B or photomasks having various modified or changed configurations thereof. In FIGS. 3A to 3D, the same reference numerals are used to denote the same elements as in FIGS. 1A and 1B, and repeated descriptions thereof are omitted.

Figure 3A:
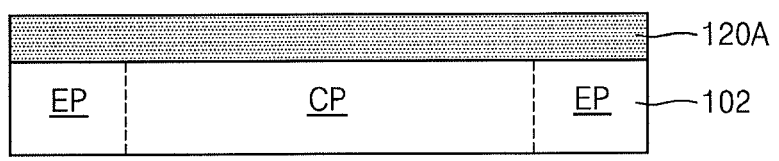
FIGS. 3A to 3D illustrate cross-sectional views of sequential processes of a method of manufacturing a photomask according to some example embodiments.

Referring to FIG. 3A, a phase shift layer 120A may be formed on a transparent substrate 120 and cover a central portion CP of the transparent substrate 102 and an edge portion EP surrounding the central portion CP.

In some embodiments, the transparent substrate 102 may be a rectangular substrate that is about 6 inches wide by about 6 inches long. In some other embodiments, the transparent substrate 102 may be a large-sized substrate, each side of which is about 300 mm or more.

The phase shift layer 120A may be formed to have a light transmittance of about 2% to about 10% with respect to exposure light that is irradiated to the phase shift layer 120A. For example, the phase shift layer 120A may be formed to have such an optical density as to provide a light transmittance of about 2% to about 10%. In some embodiments, a composition ratio between components of the phase shift layer 120A and/or a thickness of the phase shift layer 120A may be adjusted to control a light transmittance of the phase shift layer 120A.

The phase shift layer 120A may be formed to the same thickness on both the central portion CP and the edge portion EP of the transparent substrate 102.

Specific materials forming the phase shift layer 120A may be the same as those of the first phase shift pattern 122 and the second phase shift pattern 124 described with reference to FIGS. 1A and 1B.

In some embodiments, the phase shift layer 120A may be formed using a sputtering process, a vacuum evaporation process, a chemical vapor deposition (CVD) process, MOCVD a metal organic CVD (MOCVD) process, a sol-gel process, or a combination thereof.

Figure 3B:
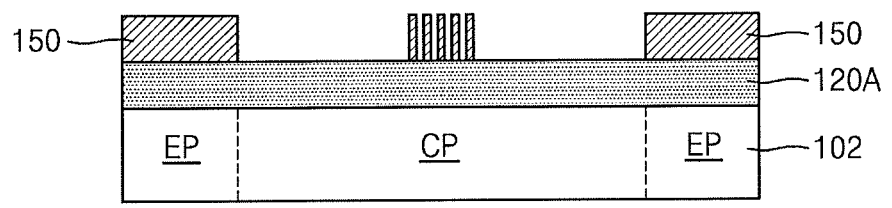

Referring to FIG. 3B, a mask pattern 150 may be formed on the phase shift layer 120A.

The mask pattern 150 may be a photoresist pattern. The photoresist pattern may include a material that may react with laser beams or electronic beams (e-beams). In some embodiments, the photoresist pattern may include positive photoresist or negative photoresist.

A thickness of the mask pattern 150 may be determined in consideration of the thickness of the phase shift layer 120A and an etch selectivity. In some embodiments, the mask pattern 150 may be formed to a thickness of about 100 Å to about 800 Å, but the present example embodiment is not limited thereto.

Figure 3C:
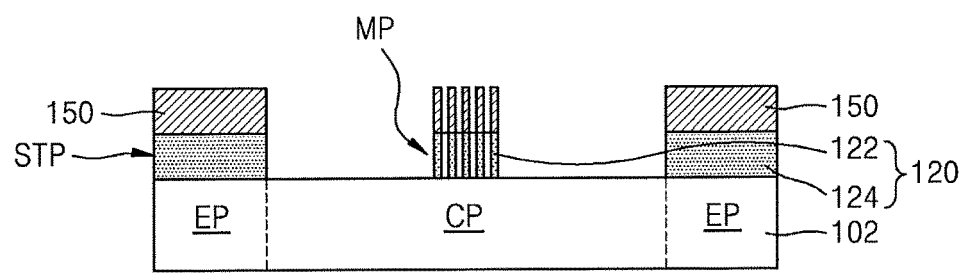

Referring to FIG. 3C, the phase shift layer 120A may be etched using the mask pattern 150 as an etch mask so that a first phase shift pattern 122 may remain on the central portion CP of the transparent substrate 102 and a second phase shift pattern 124 may remain on the edge portion EP of the transparent substrate 102.

The first phase shift pattern 122 may constitute at least one main pattern MP. The second phase shift pattern 124 may constitute a semi-transparent pattern STP.

In some embodiments, the phase shift layer 120A may be etched using a plasma etching process. For example, when the phase shift layer 120A includes MoSiON, a plasma etching process using $CF_4$, $CF_4/O_2$, $CHF_3$, $CHF_3/O_2$, $SF_6$, or $SF_6/O_2$ as an etch gas may be performed, but the present example embodiment is not limited thereto.

Figure 3D:
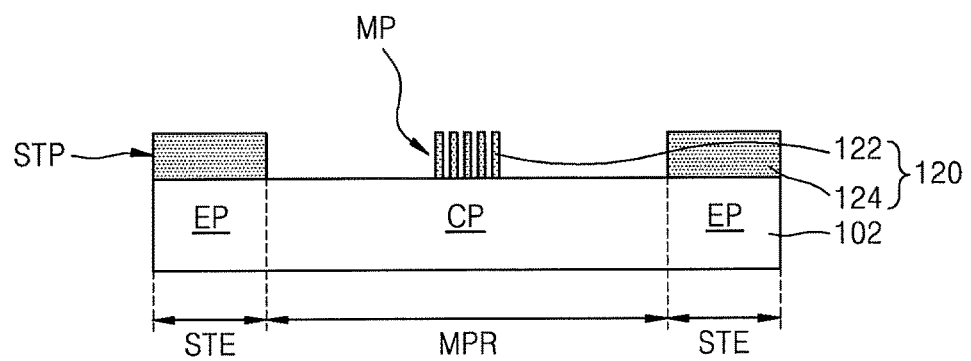

Referring to FIG. 3D, the mask pattern 150 may be removed to expose a top surface of the at least one main pattern MP and a top surface of the semi-transparent pattern STP.

The mask pattern 150 may be removed using an ashing process and a strip process.

As can be seen from FIGS. 1A to 2B, the photomasks 100 and 200 according to the present example embodiment may not include a blind region that is covered with a light shielding layer. Thus, a process of forming the light shielding layer to form the blind region and a process of removing an unnecessary portion of the light shielding layer may be omitted from processes of manufacturing the photomasks 100 and 200. Accordingly, the likelihood of occurrence of defects due to the removal of the light shielding layer may be reduced, and a turn-around time (TAT) of the photomasks 100 and 200 may be reduced. Furthermore, a lifespan of an exposure system using the photomasks 100 and 200 according to the present example embodiment may be extended, and the time and costs required for maintenance and repair of the exposure system may be reduced. In addition, when electronic devices are manufactured by means of an exposure process using the photomasks 100 and 200, productivity may be improved.

Figure 4:
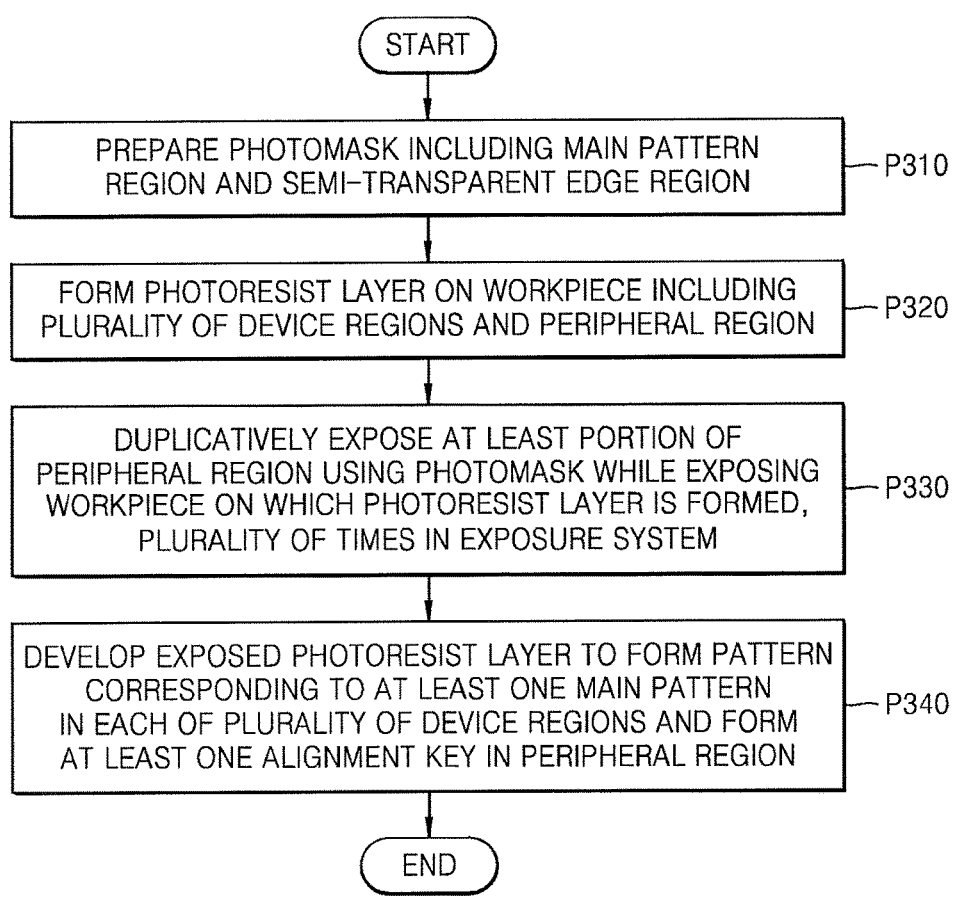
FIG. 4 illustrates a flowchart illustrating a method of manufacturing an electronic device according to example embodiments.

FIG. 4 illustrates a flowchart of a method of manufacturing an electronic device according to example embodiments.

Figure 8:
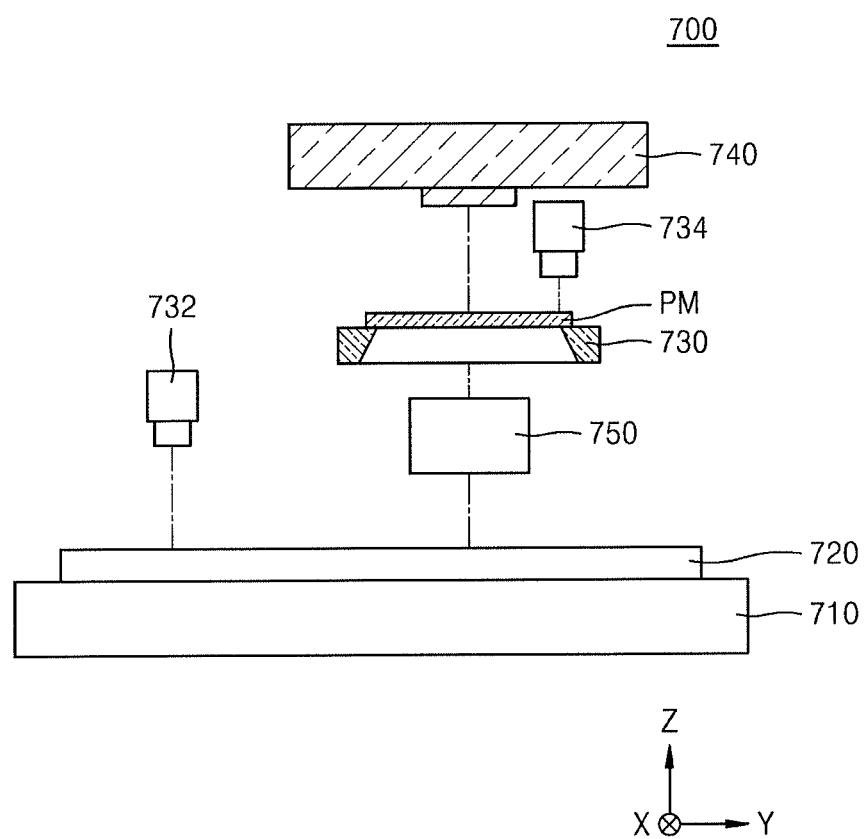
FIG. 8 illustrates a schematic diagram of an example construction of an exposure system that may be used for a method of manufacturing an electronic device and a method of manufacturing a display device according to example embodiments.

FIG. 8 illustrates a schematic construction diagram of an exposure system 700 that may be used in a method of manufacturing an electronic device according to example embodiments.

Figure 9:
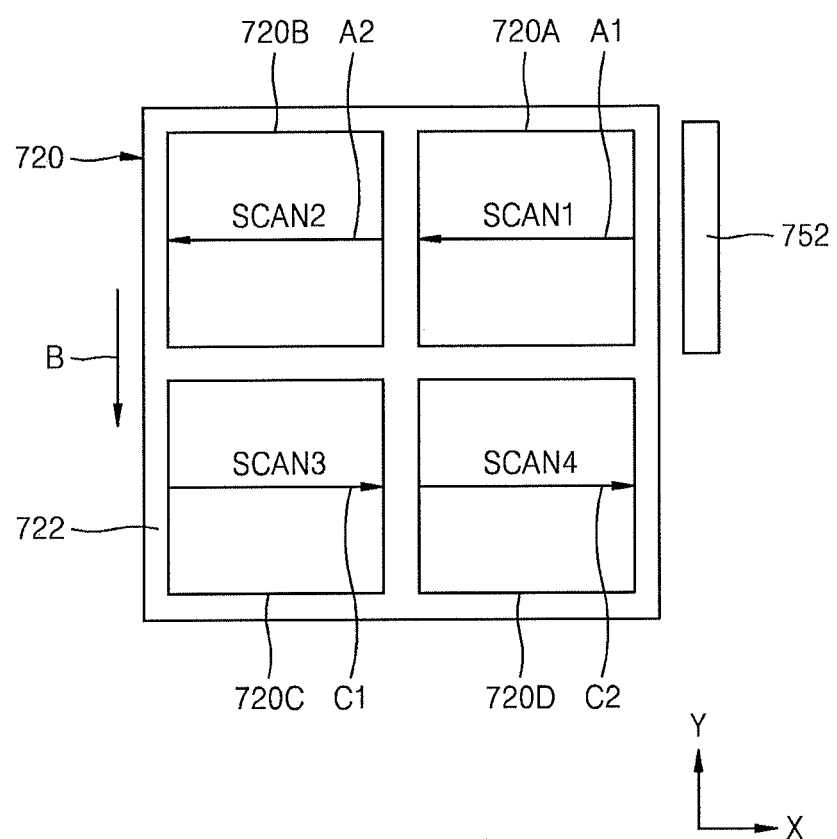
FIG. 9 illustrates a plan view of a panel that may be used for a method of manufacturing an electronic device and a method of manufacturing a display device according to example embodiments, illustrating a process of scanning the panel using an exposure system.

FIG. 9 illustrates a plan view of a panel 720 that may be used as a workpiece for a method of manufacturing an electronic device, which illustrates a process of scanning the panel 720 using the exposure system 700 shown in FIG. 8.

FIGS. 10A to 13B illustrate diagrams of sequential processes of an exposure process, which facilitate understanding an exposure method that will be described with reference to FIG. 4.

The method of manufacturing the electronic device according to the example embodiments as shown in FIG. 4 will be described with further reference to FIGS. 1A to 2B and 8 to 13B.

In process P310 of FIG. 4, a photomask including a main pattern region MPR and a semi-transparent edge region STE, which extends from an outer portion of the main pattern region MPR to an outer portion of the transparent substrate 102, may be prepared.

In some embodiments, as shown in FIGS. 1A and 1B, the photomask may be the photomask 100 in which a pattern is not formed on the semi-transparent edge region STE. In some other embodiments, as shown in FIGS. 2A and 2B, the photomask may be the photomask 200 in which the at least one auxiliary pattern AK1, AK2, and AK3 is formed on the semi-transparent edge region STE.

Hereinafter, an example in which the photomask 200 shown in FIGS. 2A and 2B is used as the photomask according to the present example embodiment will be described. However, the present example embodiment is not limited thereto and may be applied to a case in which the photomask 100 shown in FIGS. 1A and 1B is used.

In process P320 of FIG. 4, a photoresist layer may be formed on a workpiece including a plurality of device regions and a peripheral region that defines the plurality of device regions.

In some embodiments, the workpiece may be a mother substrate for manufacturing a display device or a wafer for manufacturing an integrated circuit (IC) device, but the present example embodiment is not limited thereto.

In FIGS. 8 and 9, the panel 720 that may be used as the mother substrate for manufacturing the display device is illustrated as an example of the workpiece. The panel 720 may include a plurality of device regions 720A, 720B, 720C, and 720D and a peripheral region 722 defining the plurality of device regions 720A, 720B, 720C, and 720D. In some embodiments, the peripheral region 722 may be disposed between the plurality of device regions 720A, 720B, 720C, and 720D and around the plurality of device regions 720A, 720B, 720C, and 720D. The peripheral region 722 may include a plurality of alignment key regions respectively disposed around the plurality of device regions 720A, 720B, 720C, and 720D.

Figure 10A:
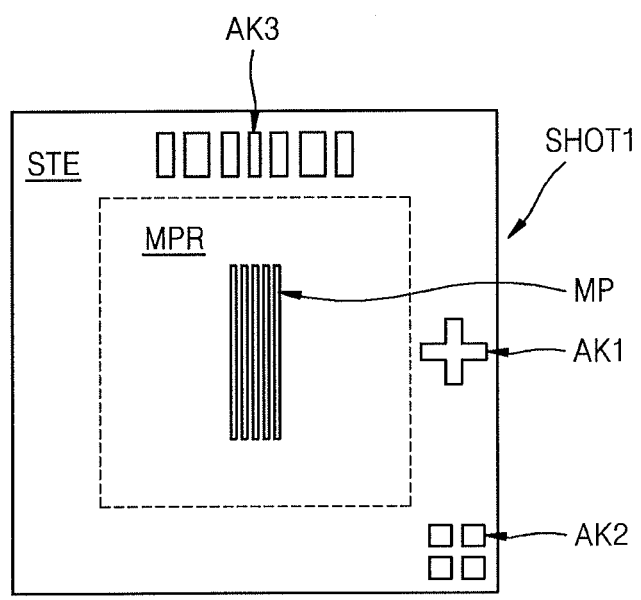
FIGS. 10A to 13B illustrate diagrams of sequential processes of an exposure process in a method of manufacturing an electronic device and a method of manufacturing a display device according to example embodiments.
Figure 10B:
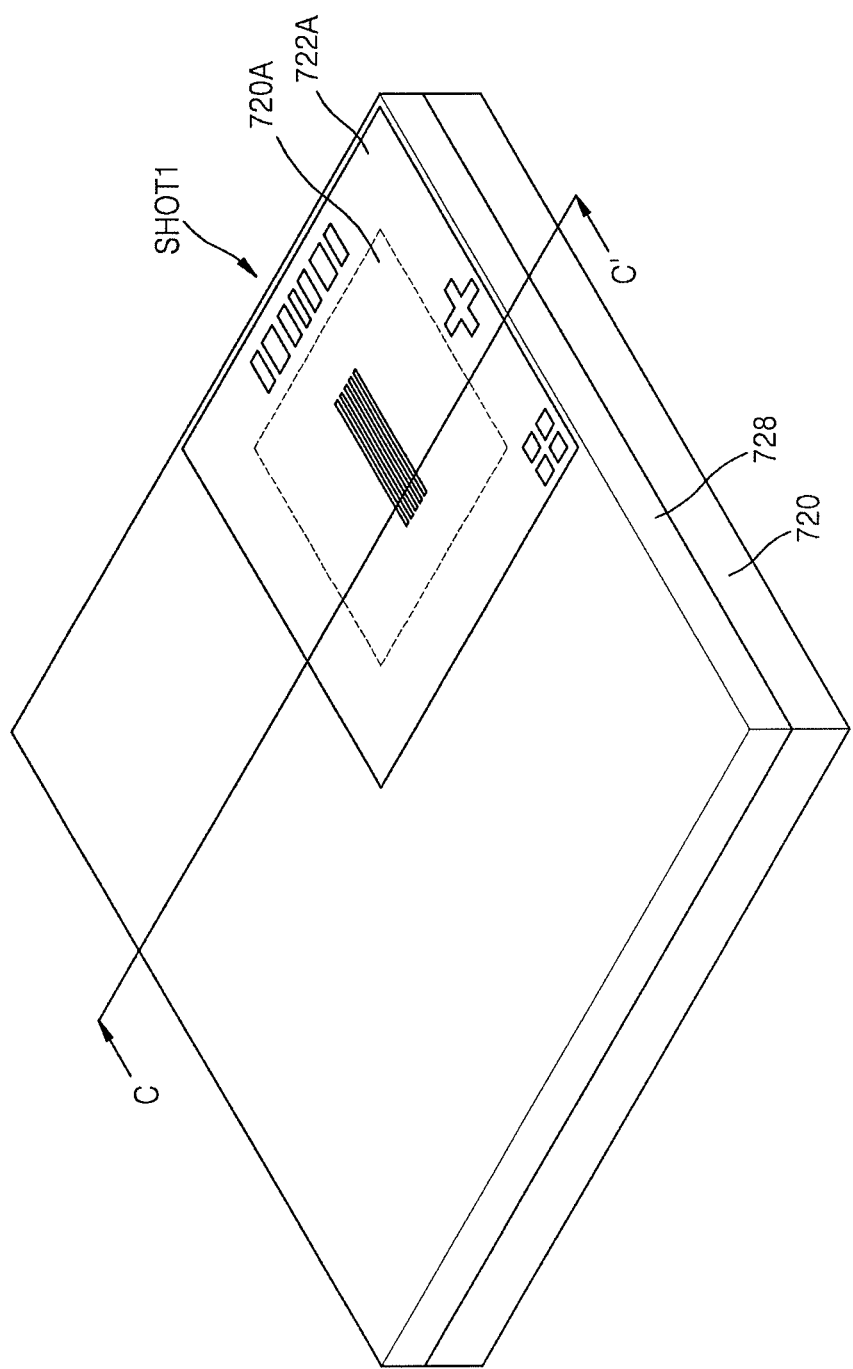

FIG. 10B illustrates a photoresist layer 728 formed on the panel 720.

Hereinafter, the method of manufacturing the electronic device as shown in FIG. 4 will be described on assumption that the panel 720 shown in FIGS. 8 and 9 is used as the workpiece.

In process P330 of FIG. 4, in the exposure system 700, while at least a portion of the peripheral region 722 of the panel 720 is being duplicatively exposed by using the photomask 200, the panel 720, which serves as the workpiece on which the photoresist layer is formed, may be exposed a plurality of times by using the photomask 200.

In some embodiments, the exposure system 700 shown in FIG. 8 may be used to perform the process P330 of FIG. 4.

The exposure system 700 shown in FIG. 8 may be, for example, a scan-type exposure system capable of performing an exposure process on a large-sized glass substrate that is used to manufacture a flat panel display (FPD).

Referring to FIG. 8, the panel 720 serving as a workpiece may be supported on a main stage 710 of the exposure system 700. In some embodiments, the panel 720 may include a glass substrate, but the present example embodiment is not limited thereto.

A photomask stage 730 for supporting a photomask PM may be disposed over the main stage 710. The photomask PM may be the photomask 100 shown in FIGS. 1A and 1B, the photomask 200 shown in FIGS. 2A and 2B, or a photomask having a modified or changed structure within the scope.

In some embodiments, when a position of the panel 720 is adjusted by the main stage 710, a first alignment key observation unit 732 may confirm a position of an alignment key on the panel 720 and adjust a position of the panel 720.

The mask stage 730 may adjust a position of the photomask PM. For example, while the photomask PM is mounted on the main stage 730, a position of the photomask PM may be adjusted, for example, in an XY plane. In some embodiments, when the position of the photomask M is adjusted by the mask stage 730, a second alignment key observation unit 734 may confirm a position of the alignment key on the photomask PM and adjust the position of the photomask PM.

An illumination optical system 740 may irradiate exposure light onto the photomask PM. A pattern formed on a partial region of the photomask PM supported on the main stage 730 may be illuminated with exposure light irradiated by the illumination optical system 740, and the exposure light that has passed through the photomask PM may pass through an imaging optical system 750 so that the pattern may be transferred to a partial region of the panel 720. Also, the mask stage 730 configured to support the photomask PM and the main stage 710 configured to support the panel 720 may be relatively scanned with respect to the imaging optical system 750 so that a main pattern formed on the main pattern region MPR of the photomask PM may be transferred onto the panel 720.

The imaging optical system 750 may include a plurality of projection optical systems. A plurality of subunit regions formed on the photomask PM may be respectively illuminated with luminous flux from the illumination optical system 740. Images of the plurality of subunit regions may be simultaneously projected on the panel 720 through the respective projection optical systems of the imaging optical system 750.

A process of scanning the panel 720 using the exposure system 700 shown in FIG. 8 will now be described with reference to FIG. 9.

The imaging optical system 750 of the exposure system 700 may have an exposure field 752 shown in FIG. 9. A first scan process SCAN1 and a second scan process SCAN2 may be sequentially performed on the panel 720 supported on the main stage 710, via an exposure field 752 in the direction of arrows A1 and A2. After the second scan process SCAN2 ends, the exposure field 752 may move in the direction of an arrow B. Thereafter, a third scan process SCAN3 and a fourth scan process SCAN4 may be performed via the exposure field 752 in the direction of arrows C1 and C2. Thus, the pattern formed on the photomask PM may be transferred to each of all the device regions 720A, 720B, 720C, and 720D of the panel 720. In the exposure system 700 shown in FIG. 8, the main stage 730 configured to support the photomask PM may have an XY stage to enable the above-described scan operation.

In the above-described scan operation, it may be necessary to precisely align a projection image of the pattern formed on the photomask PM with the pattern previously formed on the panel 720. To achieve precise alignment between the photomask PM and the panel 720, the alignment key formed on the photomask PM and the alignment key formed on the panel 720 may be employed.

While the panel 720 used as a mother substrate for manufacturing an electronic device, such as a display device has become increasingly large-sized, patterns for forming an electronic device, which are formed in the device regions 720A, 720B, 720C, and 720D of the panel 720 have become gradually downscaled and highly-integrated.

The manufacture of display devices using liquid crystals (LCs) and organic electro-luminescence (organic EL) may involve forming devices (e.g., transistors) by forming stacked structures including a plurality of conductive patterns and a plurality of insulating layers. In recent years, as display devices have required brighter and clearer images, higher operating speeds, and lower power consumption, components and unit devices of the display devices have been gradually downscaled and highly integrated to meet these requirements. In addition, patterns formed on photomasks used to manufacture the display devices have also become downscaled and highly integrated. For instance, a line width required to form a thin-film transistor (TFT) for an active-matrix-type liquid crystal display (LCD) device has also been gradually reduced. In particular, a phase shift mask (PSM) may be used as a photomask to form a fine pattern having a line width of about 2 μm or less on a panel.

In contrast, a display device may be manufactured using a large-sized mother substrate having a relatively large dimension. Fine patterns may be formed on device regions, for example, the device regions 720A, 720B, 720C, and 720D of the panel 720 shown in FIG. 9, while auxiliary patterns having larger critical dimensions (CDs) than the patterns formed on the device regions 720A, 720B, 720C, and 720D may be formed on a peripheral region 722 of the panel 720 except the device regions 720A, 720B, 720C, and 720D. The auxiliary patterns may include, for example, various kinds of alignment keys including an alignment key for aligning layers of an electronic device to be formed, an alignment key for aligning a photomask with an exposure system, an alignment key for aligning dies in a mother substrate, and an alignment key for aligning an exposure lens with the photomask, photomask codes, or test patterns.

In a general PSM, an edge region of a photomask, except a main pattern region in which a main pattern to be transferred to the device regions 720A, 720B, 720C, and 720D is formed, is used as a blind region covered with a light shielding layer. However, the edge region of the photomask may be a region in which not the main pattern required for forming devices but only auxiliary patterns, such as alignment keys, are formed. The auxiliary patterns may have a much larger size than a resolution limit of patterns formed in the main pattern region. Also, an integration density or pattern precision may be less strict in the edge region of the photomask than in the device regions 720A, 720B, 720C, and 720D of the photomask.

In the photomask according to the present example embodiment, the blind region covered with the light shielding layer may not be formed in the edge region in which the auxiliary patterns AK1, AK2, and AK2 (e.g., alignment keys) are formed. Instead, the semi-transparent edge region STE formed of the same material as the main pattern MP may be disposed in the edge region of the photomask. When the peripheral region 722 of the panel 720 is duplicatively exposed through the semi-transparent edge region STE, the auxiliary patterns AK1, AK2, and AK3 (e.g., the alignment keys) formed in the semi-transparent edge region STE are transferred to the peripheral region 722 of the panel 720 at a desired precision, and no damage or defects may occur in alignment keys that were finally formed in the peripheral region 722 of the panel 720.

Therefore, as in the process P330 of FIG. 4, a method of manufacturing an electronic device according to an example embodiment may include duplicatively exposing at least a portion of the peripheral region 722 of the panel 720 using the photomask 100 or 200 in the exposure system 700 while exposing the workpiece on which the photoresist layer is formed, a plurality of times.

In some embodiments, the exposure process using the process P330 of FIG. 4 may be performed using synthesized light emitted by i-line (365 nm), g-line (436 nm), h-line (405 nm), or a combination thereof. In some other embodiments, the exposure process using the process P330 of FIG. 4 may be performed using a KrF excimer laser (248 nm) or an ArF excimer laser (193 nm). However, a light source applicable to the method of manufacturing the electronic device according to the example embodiments is not limited to the above-described examples, and various other known light sources may be adopted.

Figure 5:
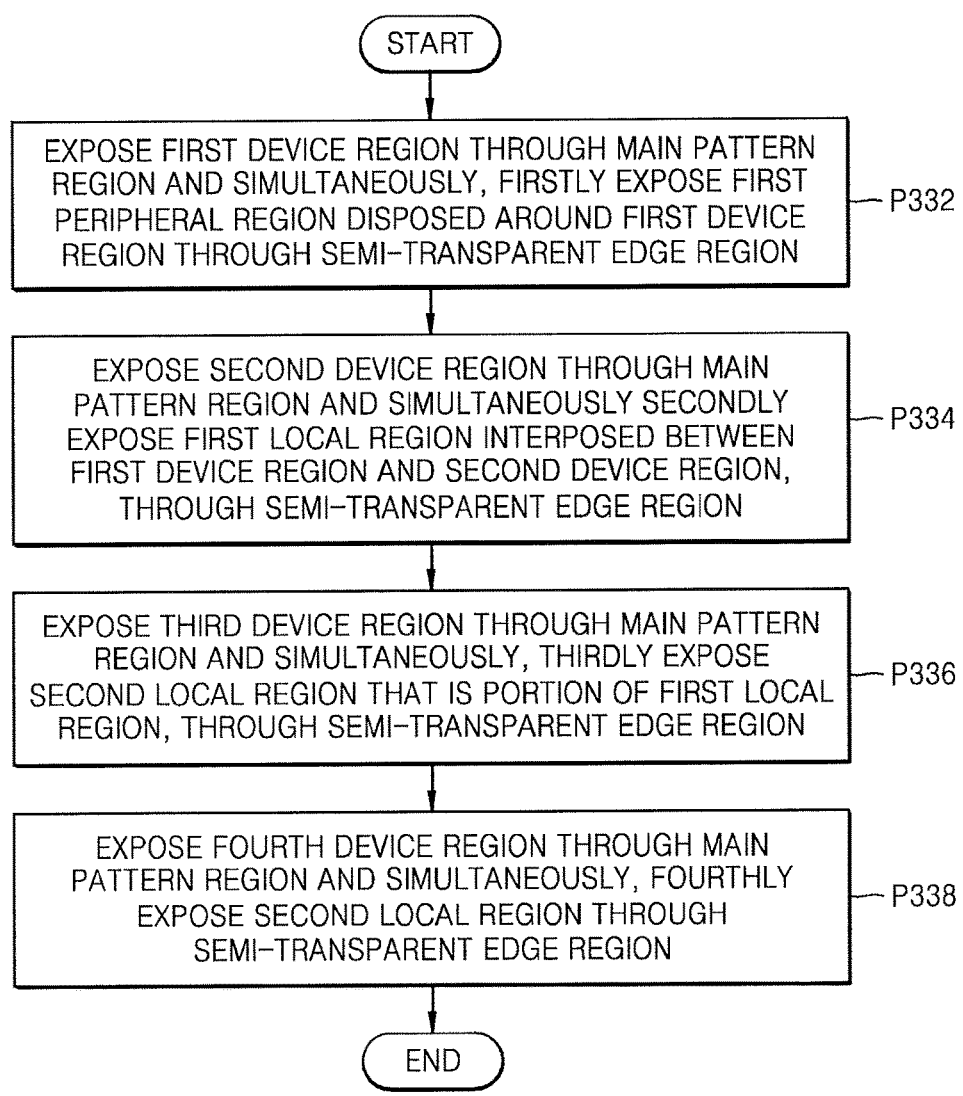
FIG. 5 illustrates a flowchart of an exposure method that is applicable to a method of manufacturing an electronic device according to example embodiments.

FIG. 5 illustrates a flowchart of an exposure process using the process P330 of FIG. 4, according to an example embodiment.

The exposure process using the process P330 of FIG. 4, according to the example embodiment, will now be described with reference to FIGS. 5 and 9 to 13B.

Hereinafter, an example in which the photomask 200 shown in FIGS. 2A and 2B is used as the photomask according to the present example embodiment will be described. However, an exposure process according to the present example embodiment is not limited thereto and may be similarly applied to a case in which the photomask 100 shown in FIGS. 1A and 1B is used.

Referring to FIGS. 5 and 10A to 10C, in the process P332 of FIG. 5, the first device region 720A may be exposed through the main pattern region MPR of the photomask 200 and simultaneously, a first peripheral region 722A disposed around the first device region 720A may be firstly exposed through the semi-transparent edge region STE of the photomask 200.

The first device region 720A may be one selected from a plurality of device regions 720A, 720B, and 720C, and 720D that are formed on the panel 720 and covered with the photoresist layer 728. The first device region 720A may be exposed so that at least one main pattern MP (refer to FIGS. 2A and 2B) may be transferred to the photoresist layer 720 disposed on the first device region 720A. While the first device region 720A is being exposed, the first peripheral region 722A disposed around the first device region 720A, among the peripheral region 722 of the panel 720, may be simultaneously exposed through the semi-transparent edge region STE of the photomask 200.

FIG. 10A illustrates an image that is transferred by a first shot SHOT1 affected by the first scan process SCAN1 described with reference to FIG. 9. As used herein, the term "shot" refers to a plan image transferred onto the panel 720 when a photomask is scanned once.

FIG. 10B illustrates a schematic view of a region of the photoresist layer 728 formed on the panel 720, to which an image is transferred by the first shot SHOT1.

Figure 10C:
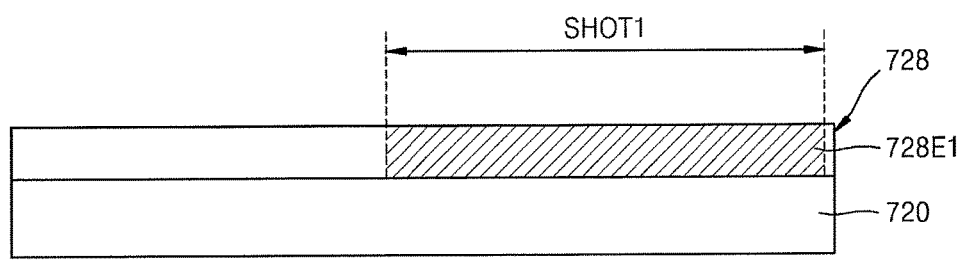

FIG. 10C illustrates a cross-sectional view taken along line C-C' of FIG. 10B, which illustrates a region 728E1 of the photoresist layer 728, which is firstly exposed by the first shot SHOT1.

By exposing the first device region 720A and the first peripheral region 722A disposed around the first device region 720A through the main pattern region MPR and the semi-transparent edge region STE of the photomask 200 using the process P332 of FIG. 5, an image of the at least one main pattern MP may be transferred to the photoresist layer 728 formed on the first device region 720A, and an image of the at least one auxiliary pattern AK1, AK2, and AK3 may be transferred to the first peripheral region 722A.

Referring to FIGS. 5 and 11A to 11C, in the process P334 of FIG. 5, the second device region 720B may be exposed through the main pattern region MPR of the photomask 200. While the second device region 720B is being exposed, a second peripheral region 722B disposed around the second device region 720B, among the peripheral region 722 of the panel 720, may be simultaneously exposed through the semi-transparent edge region STE of the photomask 200. The second peripheral region 722B may overlap the first peripheral region 722A in a first local region LAB interposed between the first device region 720A and the second device region 720B. Accordingly, while the second device region 720B is being exposed, the first local region LAB interposed between the first device region 720A and the second device region 720B, among the first peripheral region 722A, may be secondly exposed so that the first local region LAB may be in a doubly exposed state.

The second device region 720B may be a region adjacent to the first device region 720 from among the plurality of device regions 720A, 720B, 720C, and 720D. Thus, by exposing the second device region 720B, an image of the at least one main pattern MP (refer to FIGS. 2A and 2B) may be transferred to the photoresist layer 728 formed on the second device region 720B. While the second device region 720B is being exposed, an image of the at least one auxiliary pattern AK1, AK2, and AK3 may be transferred to the second peripheral region 722B through the semi-transparent edge region STE of the photomask 200.

Figure 11A:
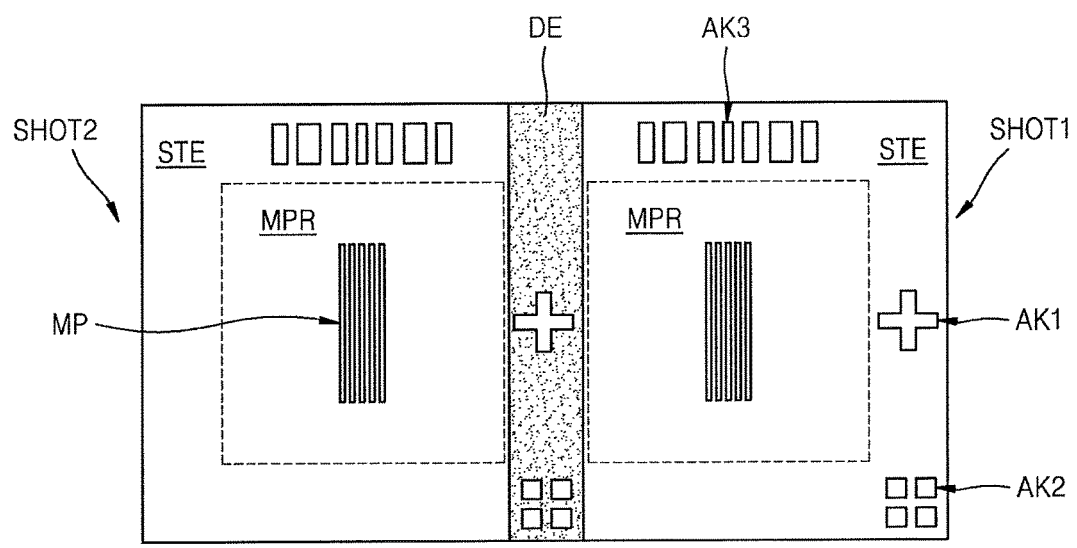

FIG. 11A illustrates an image that is transferred by the first shot SHOT1 affected by the first scan process SCAN1 described with reference to FIG. 9, and an image that is transferred by the second shot SHOT2 affected by the second scan process SCAN2.

In FIG. 11A, an overlap region between a region of the first shot SHOT1 and a region of the second shot SHOT2 may correspond to the first local region LAB. A first exposure process using the first shot SHOT1 and a second exposure process using the second shot SHOT2 may be performed, thereby forming a double exposure region DE in the first local region LAB.

Figure 11B:
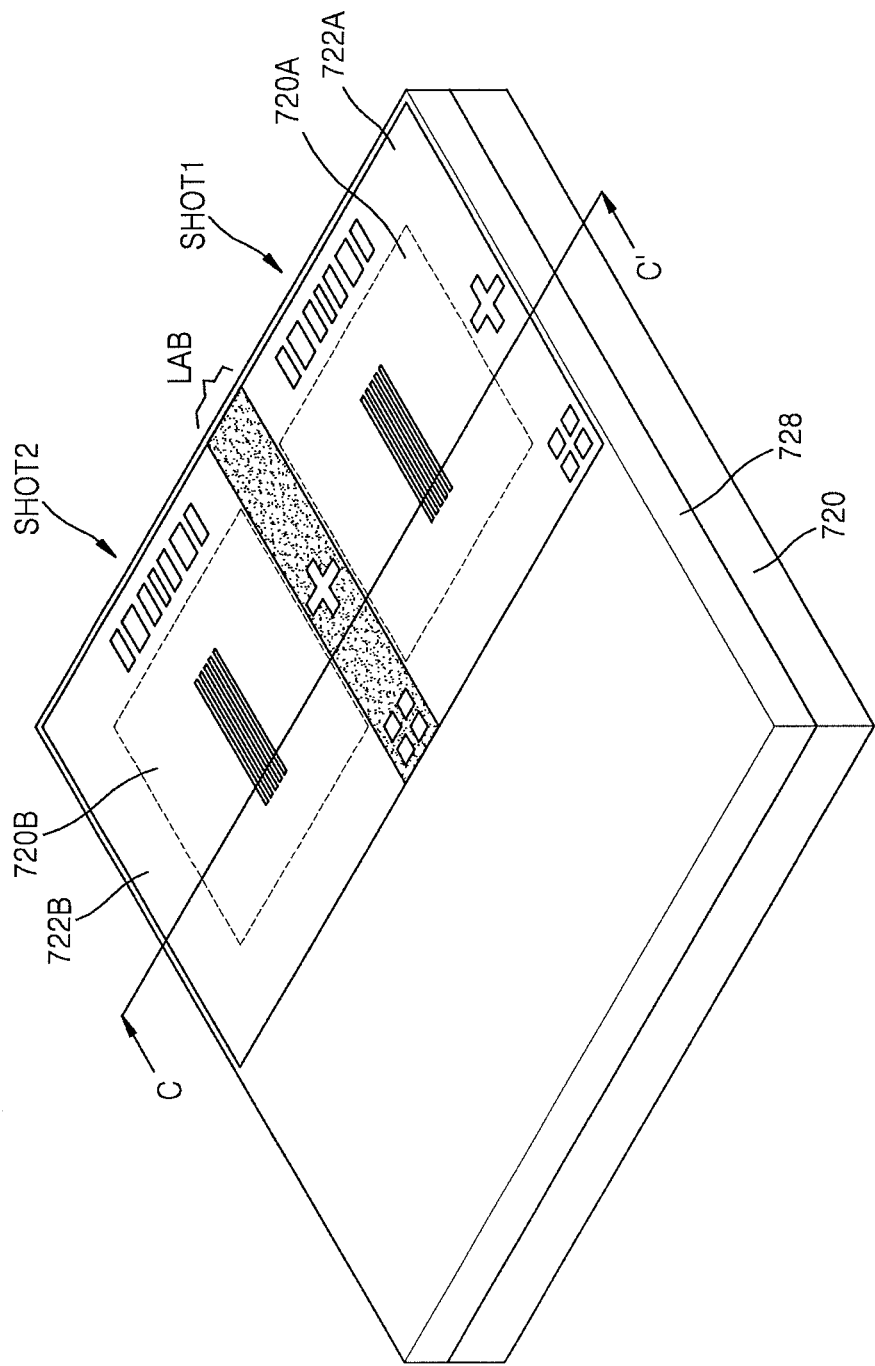
Figure 11C:
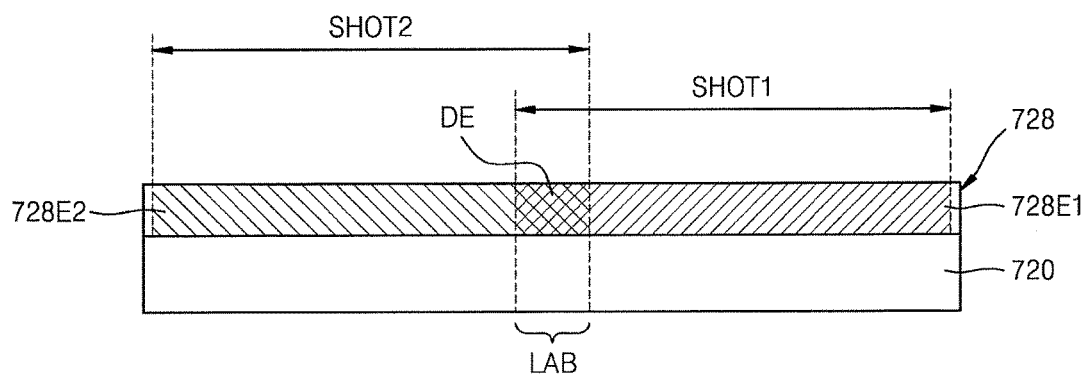

FIG. 11B illustrates a schematic image transferred to the photoresist layer 728 formed on the panel 720 due to the first shot SHOT1 and a schematic image transferred to the photoresist layer 728 formed on the panel 720 due to the second shot SHOT2.

FIG. 1C illustrates a cross-sectional view taken along a line C-C' of FIG. 11, which illustrates the region 728E1 of the photoresist layer 728, which is firstly exposed by using the first shot SHOT1, and a region 728E2 of the photoresist layer 728, which is secondly exposed by using the second shot SHOT2.

In accordance with the process P334 of FIG. 5, the second device region 720B and the second peripheral region 722B disposed around the second device region 720B may be exposed through the main pattern region MPR and the semi-transparent edge region STE. Thus, an image of at least one main pattern MP may be transferred to the photoresist layer 728 formed on the second device region 720B, and images of the at least one auxiliary patterns AK1, AK2, and AK3 may be transferred to the second peripheral region 722B. Also, at least one of the images of the auxiliary patterns AK1, AK2, and AK3 may be transferred to the first local region LAB.

Figure 12A:
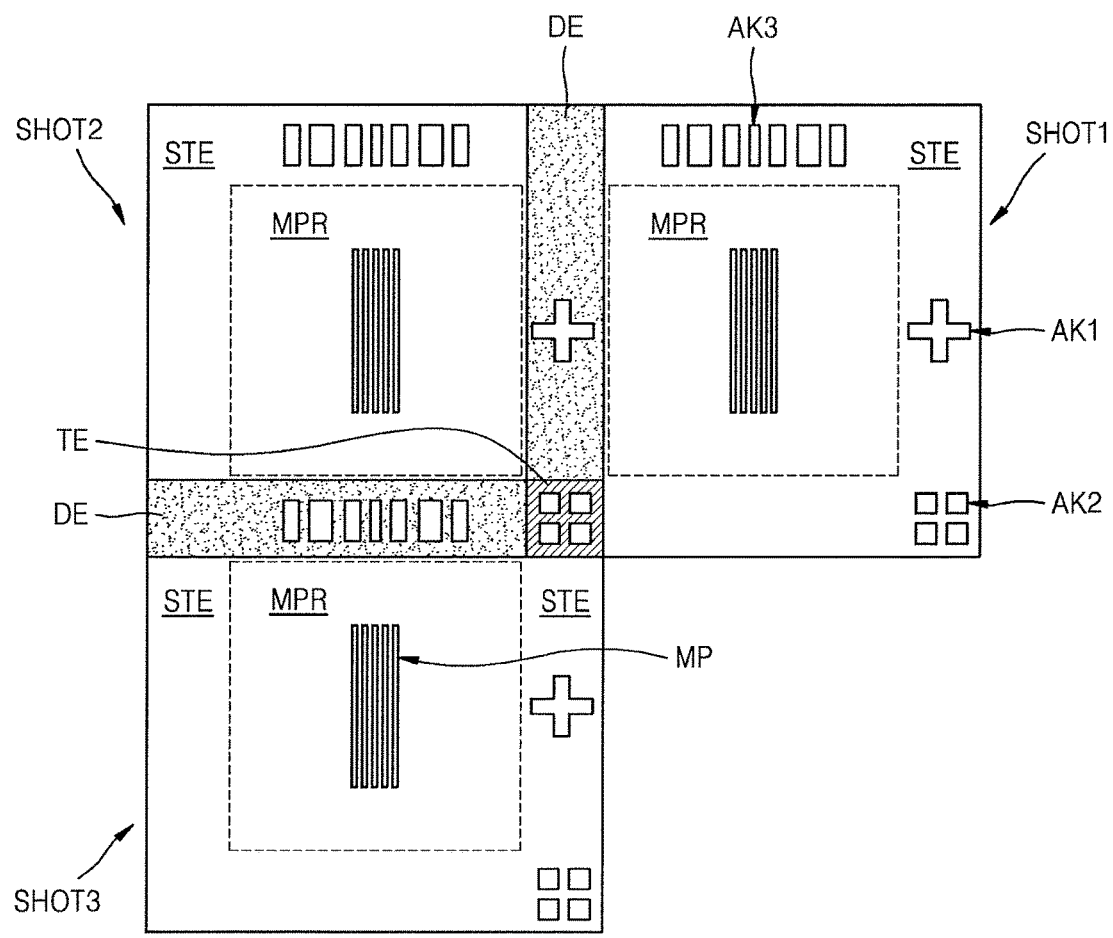
Figure 12B:
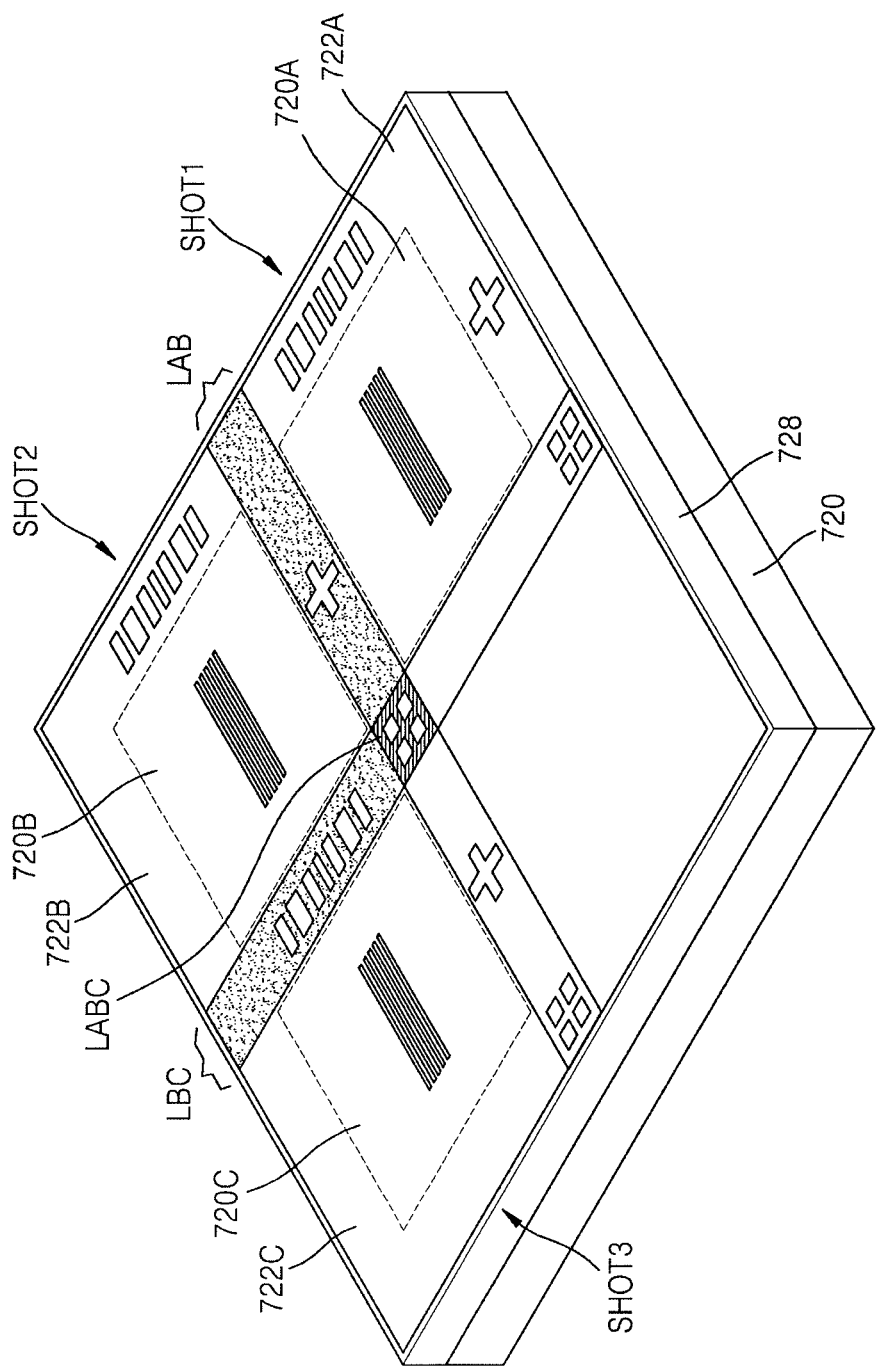

Referring to FIGS. 5, 12A, and 12B, in process P336 of FIG. 5, the third device region 720C may be exposed through the main pattern region MPR of the photomask 200 and simultaneously, a second local region LABC, which is a portion of the first local region LAB, may be thirdly exposed through the semi-transparent edge region STE of the photomask 200.

The third device region 720C may be a region adjacent to the second device region 720B from among the plurality of device regions 720A, 720B, 720C, and 720D. By exposing the third device region 720C, at least one main pattern MP (refer to FIGS. 2A and 2B) may be transferred to the photoresist 728 formed on the third device region 720C. While the third device region 720C is being exposed, a third peripheral region 722C disposed around the third device region 720C, among the peripheral region 722 of the panel 720, may be simultaneously exposed through the semi-transparent edge region STE of the photomask 200. The third peripheral region 722C may overlap the second peripheral region 722B in a local region LBC interposed between the second device region 720B and the third device region 720C. Accordingly, while the third device region 720C is being exposed, the local region LBC, which overlaps the second peripheral region 722B in the third peripheral region 722C, may be doubly exposed, and the second local region LABC, which is the portion of the first local region LAB of the third peripheral region 722C, may be trebly exposed.

FIG. 12A illustrates schematic images that are respectively transferred by the first shot SHOT1 affected by the first scan process SCAN1 described with reference to FIG. 9, the second shot SHOT2 affected by the second scan process SCAN2, and a third shot SHOT3 affected by a third scan process SCAN3.

In FIG. 12A, each of an overlap region between a region of the first shot SHOT1 and a region of the second shot SHOT2 and an overlap region between the region of the second shot SHOT2 and a region of the third shot SHOT3 may be a double exposure region DE. Also, an overlap region among the region of the first shot SHOT1, the region of the second shot SHOT2, and the region of the third shot SHOT3 may be a treble exposure region TE.

FIG. 12B illustrates schematic images respectively transferred by the first shot SHOT1, the second shot SHOT2, and the third shot SHOT3 to the photoresist layer 728 formed on the panel 720.

In FIG. 12B, the first local region LAB may include a region that is doubly exposed due to a first exposure process using the first shot SHOT1 and a second exposure process using the second shot SHOT2. The second local region LABC, which is a partial region of the first local region LAB that is included in the third peripheral region 722C, may be a trebly exposed region. Also, the local region LBC of the peripheral region 722, which is interposed between the second device region 720B and the third device region 720C, may include a region that is doubly exposed using the first exposure process using the second shot SHOT2 and a third exposure process using the third shot SHOT3.

In accordance with the process P336 of FIG. 5, the third device region 720C and the third peripheral region 722C may be exposed through the main pattern region MPR and the semi-transparent edge region STE of the photomask 200, so images of the at least one main pattern MP may be transferred to the photoresist layer 728 formed on the third device region 720C, and images of the at least one auxiliary pattern AK1, AK2, and AK3 may be transferred to the third peripheral region 722C. Also, while the images of the at least one auxiliary pattern AK1, AK2, and AK3, which were transferred by exposing the second device region 720B and the second peripheral region 722B, remain on the photoresist layer 728, the third device region 720C and the third peripheral region 722C may be exposed. As a result, at least one of the mages of the at least one auxiliary pattern AK1, AK2, and AK3 already formed in the peripheral region 722 may be exposed to exposure light again.

Figure 13A:
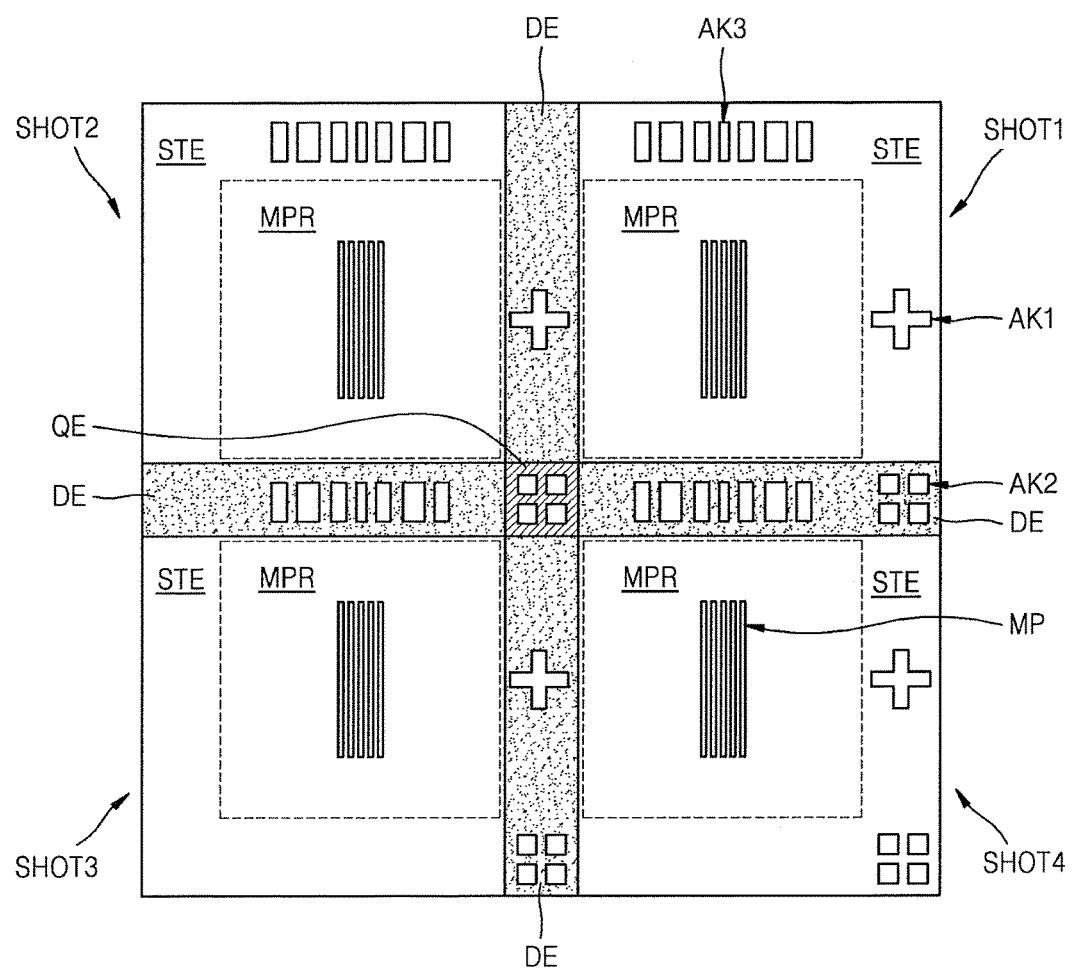
Figure 13B:
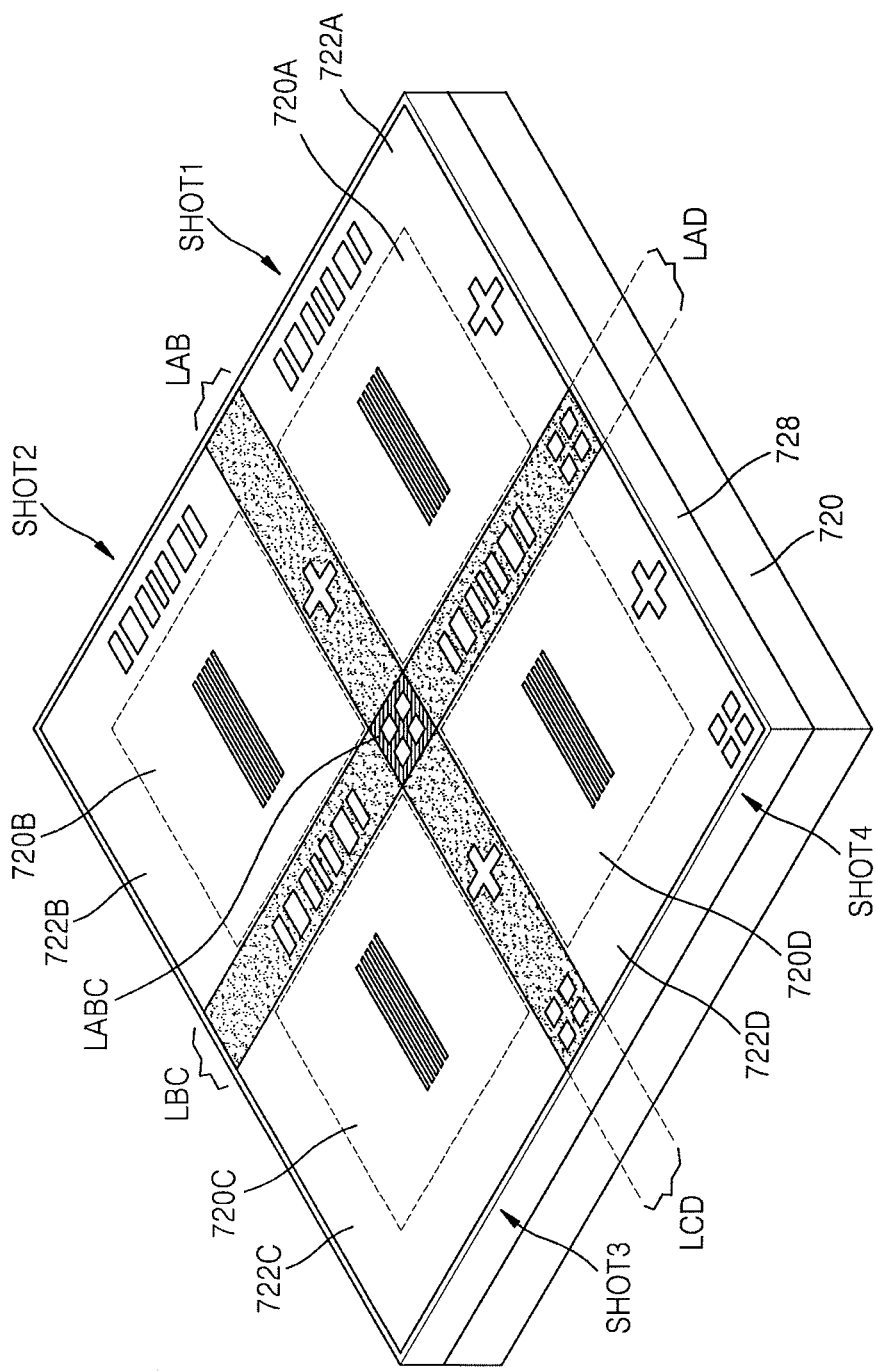

Referring to FIGS. 5, 13A, and 13B, in process P338 of FIG. 5, the fourth device region 720D may be exposed through the main pattern region MPR of the photomask 200 and simultaneously, the second local region LABC may be fourthly exposed through the semi-transparent edge region STE of the photomask 200.

The fourth device region 720D may be a region adjacent to the first device region 720A and the third device region 720C among the plurality of device regions 720A, 720B, 720C, and 720D. By exposing the fourth device region 720D, at least one main pattern MP (refer to FIGS. 2A and 2B) may be transferred to the photoresist layer 728 formed on the fourth device region 720D. While the fourth device region 720D is being exposed, a fourth peripheral region 722D disposed around the fourth device region 720D, among the peripheral region 722 of the panel 720, may be simultaneously exposed through the semi-transparent edge region STE of the photomask 200. In this case, a second local region LAB may also be exposed in the peripheral region 722, so that the second local region LABC may be quadruply exposed.

Furthermore, in the peripheral region 722, each of a local region LCD interposed between the third device region 720C and the fourth device region 720D and a local region LAD interposed between the first device region 720A and he fourth device region 720D may include a doubly exposed region.

FIG. 13A illustrates schematic images that are respectively transferred by the first shot SHOT1 affected by the first scan process SCAN1 described with reference to FIG. 9, the second shot SHOT2 affected by the second scan process SCAN2, the third shot SHOT3 affected by the third scan process SCAN3, and a fourth shot SHOT4 affected by the fourth scan process SCAN4.

In FIG. 13A, each of an overlap region between the region of the first shot SHOT1 and the region of the second shot SHOT2, an overlap region between the region of the second shot SHOT2 and the region of the third shot SHOT3, an overlap region between the region of the third shot SHOT3 and a region of the fourth shot SHOT4, and an overlap region of the region of the first shot SHOT1 and the region of the fourth shot SHOT4 may include a double exposure region DE. Also, an overlap region among the region of the first shot SHOT1, the region of the second shot SHOT2, the region of the third shot SHOT3, and the region of the fourth shot SHOT4 may be a quadruple exposure region QE.

FIG. 13B illustrates schematic images that are respectively transferred by the first shot SHOT1, the second shot SHOT2, the third shot SHOT3, and the fourth shot SHOT4 to the photoresist layer 728 formed on the panel 720.

In FIG. 13B, the first local region LAB may include a region that is doubly exposed by a first exposure process using the first shot SHOT1 and a second exposure process using the second shot SHOT2, and the second local region LABC may be a quadruply exposed region. Also, in the peripheral region 7822, each of the local region LBC interposed between the second device region 720B and the third device region 720C, the local region LCD interposed between the third device region 720C and the fourth device region 720D, and the local region LAD interposed between the first device region 720A and the fourth device region 720D may include a doubly exposed region.

In accordance with the process P338 of FIG. 5, the fourth device region 720D and the fourth peripheral region 722D disposed around the fourth device region 720D may be exposed through the main pattern region MPR and the semi-transparent edge region STE of the photomask 200. Thus, images of the at least one main pattern MP may be transferred to the photoresist layer 728 formed on the fourth device region 720D, and images of the at least one auxiliary pattern AK1, AK2, and AK3 may be transferred to the fourth peripheral region 722D. Also, before the fourth device region 720D and the fourth peripheral region 722D are exposed, while the images of the at least one auxiliary pattern AK1, AK2, and AK3 are already formed on the photoresist layer 728 in the peripheral region 722, the fourth device region 720D and the fourth peripheral region 722D may be exposed. Thus, at least one of the images of the at least one auxiliary pattern AK1, AK2, AK3 already formed in the peripheral region 722 may be exposed to exposure light again.

Although a case in which the scan-type exposure system 700 is used to perform the process P330 of FIG. 4 and the processes P332 to P338 of FIG. 5 was described above, the present example embodiment is not limited thereto. For example, a stepper-type exposure system may be used to perform the process P330 of FIG. 4 and the processes P332 to P338 of FIG. 5.

Referring back to FIG. 4, in process P340, the exposed photoresist layer 728 may be developed as shown in FIG. 13B, so that a photoresist pattern having a shape corresponding to the at least one main pattern MP may be formed in each of the plurality of device regions 720A, 720B, 720C, and 720D, and at least one alignment key having shapes corresponding to the at least one auxiliary pattern AK1, AK2, AK3 may be formed in the peripheral region 722.

The at least one alignment key formed in the peripheral region 722 may be formed by transferring images of the auxiliary patterns AK1, AK2, and AK3, and include various kinds of alignment keys including an alignment key for aligning layers of an electronic device to be formed, an alignment key for aligning a photomask with an exposure system, an alignment key for aligning dies in a mother substrate, and an alignment key for aligning an exposure lens with the photomask, or photomask codes.

The at least one alignment key formed in the peripheral region 722 may have a greater CD than the patterns formed in the device region 720A, 720B, 720C, and 720D. In some embodiments, a minimum feature size of the at least one alignment key formed in the peripheral region 722 may be about 10 times to about 300 times larger than that of the patterns formed in the device regions 720A, 720B, 720C, and 720D. Thus, the at least one alignment key formed in the peripheral region 722 may have a much larger size than the patterns formed in the device regions 720A, 720B, 720C, and 720D. An integration density or pattern precision of the at least one alignment key formed in the peripheral region 722 may be not stricter than the patterns formed in the device regions 720A, 720B, 720C, and 720D. Accordingly, even if a double exposure process or a quadruple exposure process is performed according to the methods described with reference to FIGS. 4 and 5, alignment keys having desired dimensions and resolutions may be formed in the peripheral region 722.

In the methods of manufacturing the electronic device described with reference to FIGS. 4, 5, and 8 through 13B, an exposure process may be performed using the photomask 100 or 200 that is free from a blind region covered with a light shielding layer. As described above, since the photomask 100 or 200 required for the exposure process does not include a light shielding layer, the photomask 100 or 200 may be formed using a simple forming process and a process of removing the unnecessary light shielding layer may be omitted. Thus, the exposure process may be performed using the photomask 100 or 200, which is formed using a process from which the likelihood of occurrence of defects may be eliminated. Accordingly, a TAT of the photomask 100 or 200 required to manufacture an electronic device may be reduced, and a lifespan of an exposure system used to manufacture the electronic device may be extended. Also, the time and costs required for maintenance and repair of the exposure system may be reduced. As a result, electronic device manufacturing productivity may be improved.

Figure 6:
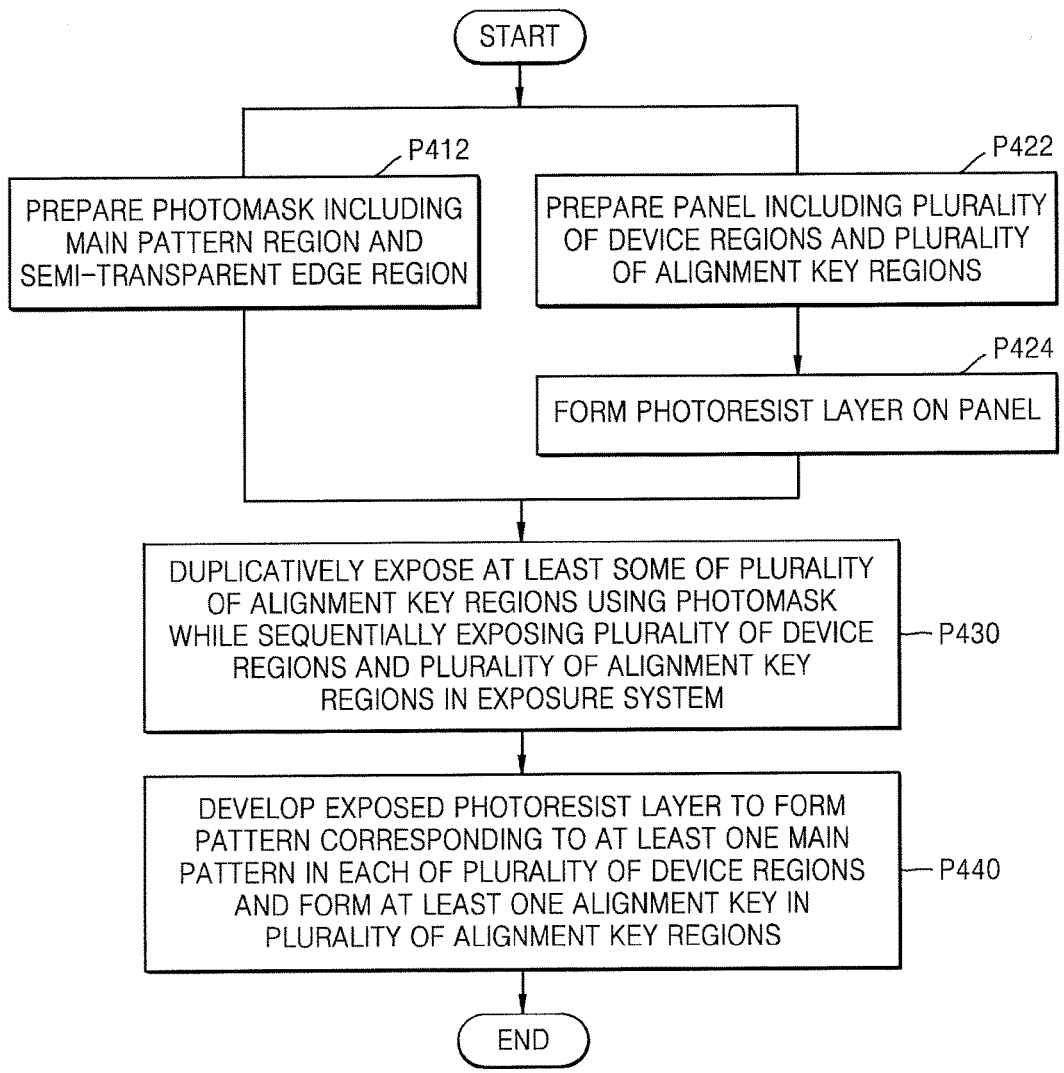
FIG. 6 illustrates a flowchart illustrating a method of manufacturing a display device according to example embodiments.

FIG. 6 illustrates a flowchart of a method of manufacturing a display device according to example embodiments.

A method of manufacturing a display device according to an example embodiment will now be described with reference to FIGS. 6 and 8 to 13B. Hereinafter, the same descriptions as those presented with reference to FIGS. 8 to 13B will be omitted.

In process P412 of FIG. 6, a photomask may be prepared. The photomask may include a main pattern region MPR and a semi-transparent edge region STE, which extends from an outer portion of the main pattern region MPR to an outer portion of a transparent substrate 102.

The present embodiment will be described on assumption that the photomask 200 shown in FIGS. 2A and 2B is used as the photomask.

In process P422 of FIG. 6, a panel including a plurality of device regions and a plurality of alignment key regions may be prepared.

In some embodiments, the panel may be the panel 720 including first to fourth device regions 720A, 720B, 720C, and 720D and first to fourth peripheral regions 722A, 722B, 722C, and 722D as shown in FIG. 9. The first to fourth peripheral regions 722A, 722B, 722C, and 722D of the panel 720 may constitute a plurality of alignment key regions, respectively.

In process P424 of FIG. 6, a photoresist layer 728 may be formed on the panel 720.

The photoresist layer 728 may be formed to cover the first to fourth peripheral regions 722A, 722B, 722C, and 722D that surround the first to fourth device regions 720A, 720B, 720C, and 720D, respectively.

In process P430 of FIG. 6, in an exposure system, at least a portion of the first to fourth peripheral regions 722A, 722B, 722C, and 722D that are the plurality of alignment key regions may be duplicatively exposed using the photomask 200, while the plurality of device regions 720A, 720B, 720C, and 720D and the first to fourth peripheral regions 722A, 722B, 722C, and 722D, which are covered with the photoresist layer 728, may be sequentially exposed.

In some embodiments, the exposure system 700 shown in FIG. 8 may be used as the exposure system.

In some embodiments, the exposure process in accordance with the process P430 of FIG. 6 may be performed using synthesized light emitted by i-line (365 nm), g-line (436 nm), h-line (405 nm), or a combination thereof. For example, the exposure process may be performed using light having an ultraviolet (UV) combined wavelength (g-line, h-line, or i-line) emitted by a mercury lamp as an exposure light source. In some other embodiments, the exposure process using the process P430 of FIG. 6 may be performed using a KrF excimer laser (248 nm) or an ArF excimer laser (193 nm). However, a light source applicable to the method of manufacturing the display device according to the example embodiments is not limited to the above-described examples, and various other known light sources may be adopted.

Figure 7:
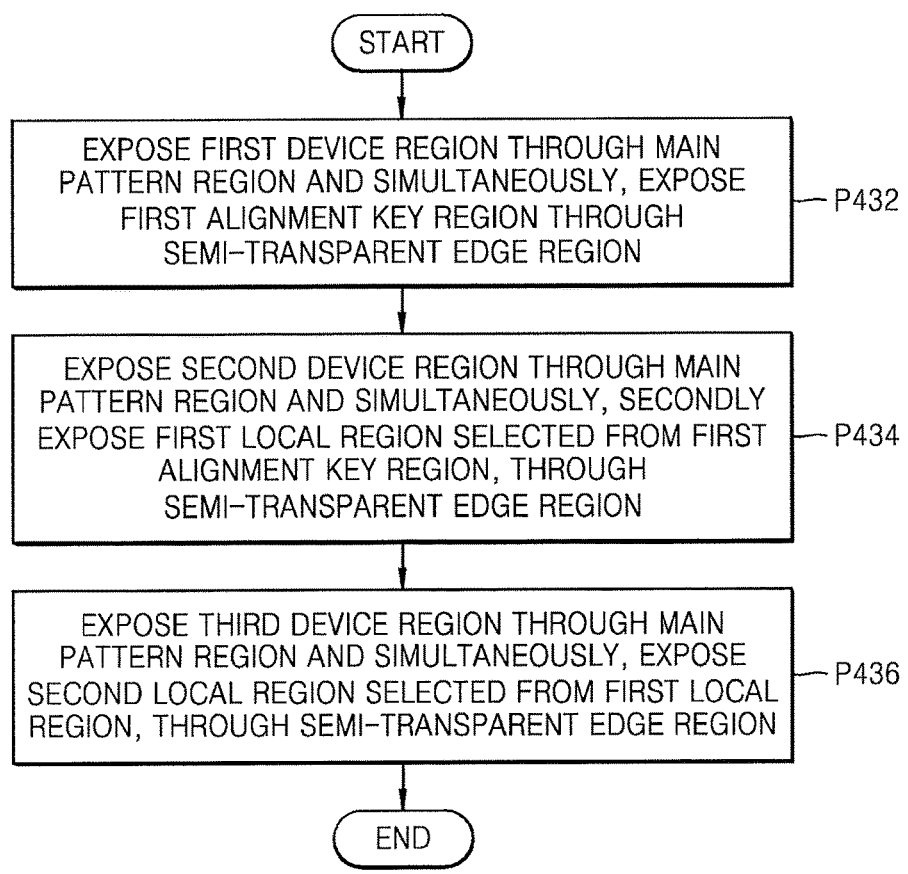
FIG. 7 illustrates a flowchart of an exposure method that is applicable to a method of manufacturing a display device according to example embodiments.

FIG. 7 illustrates a flowchart illustrating an exposure process using the process P430 of FIG. 6, according to an example embodiment.

The exposure process using the process P430 of FIG. 6 will now be described with reference to FIGS. 7 and 9 to 13B.

In process P432 of FIG. 7, the first device region 720A may be exposed through the main pattern region MPR of the photomask 200 and simultaneously, a first peripheral region 722A, which is a first alignment key region disposed around the first device region 720A, may be firstly exposed through the semi-transparent edge region STE of the photomask 200.

Since the first exposure process in accordance with the process P432 of FIG. 7 is about the same as described in the process P332 of FIG. 5, detailed descriptions thereof are omitted.

In process P434 of FIG. 7, the second device region 720B may be exposed through the main pattern region MPR of the photomask 200 and simultaneously, a first local region LAB, which is selected from the first peripheral region 722A that is the first alignment key region, may be secondly exposed through the semi-transparent edge region STE of the photomask 200.

Since the second exposure process in accordance with the process P434 of FIG. 7 is about the same as described in the process P334 of FIG. 5, detailed descriptions thereof are omitted.

In process P436 of FIG. 7, the third device region 720C may be exposed through the main pattern region MPR of the photomask 200 and simultaneously, a second local region LABC, which is selected from the first local region LAB, may be exposed through the semi-transparent edge region STE of the photomask 200.

In some embodiments, the exposure process in accordance with the process P436 of FIG. 7 may be performed in a generally similar manner to the third exposure process in accordance to the process P336 of FIG. 5.

In some other embodiments, the exposure process in accordance with the process P436 of FIG. 7 may be performed in a generally similar manner to the fourth exposure process in accordance with the process P338 of FIG. 5.

Referring back to FIG. 6, in process P440, the exposed photoresist layer 728 may be exposed so that a photoresist pattern having a shape corresponding to the at least one main pattern MP may be formed in each of the plurality of device regions, for example, the device regions 720A, 720B, 720C, and 720D, and at least one alignment key may be formed in the peripheral region 722 including the first through fourth peripheral regions 722A, 722B, 722C, and 722D that are alignment key regions.

Since the process in accordance with the process P440 of FIG. 6 is about the same as described in the process P340 of FIG. 4, detailed descriptions thereof are omitted.

In the method of manufacturing the display device according to the example embodiment as described with reference to FIGS. 6 and 7, an exposure process may be performed using the photomask 200 that is free from a blind region covered with a light shielding layer. Thus, since the photomask 200 required for the exposure process does not include the light shielding layer, the photomask 200 may be formed using a simple process and a process of removing the unnecessary light shielding layer may be omitted. Thus, the exposure process may be performed using the photomask 200, which is formed using a process in which the likelihood of occurrence of defects may be reduced. Accordingly, a TAT of the photomask 200 required to manufacture the display device may be reduced, and a lifespan of an exposure system used to manufacture the display device may be extended. Also, the time and costs required for maintenance and repair of the exposure system may be reduced. As a result, display device manufacturing productivity may be improved.

Figure 14:
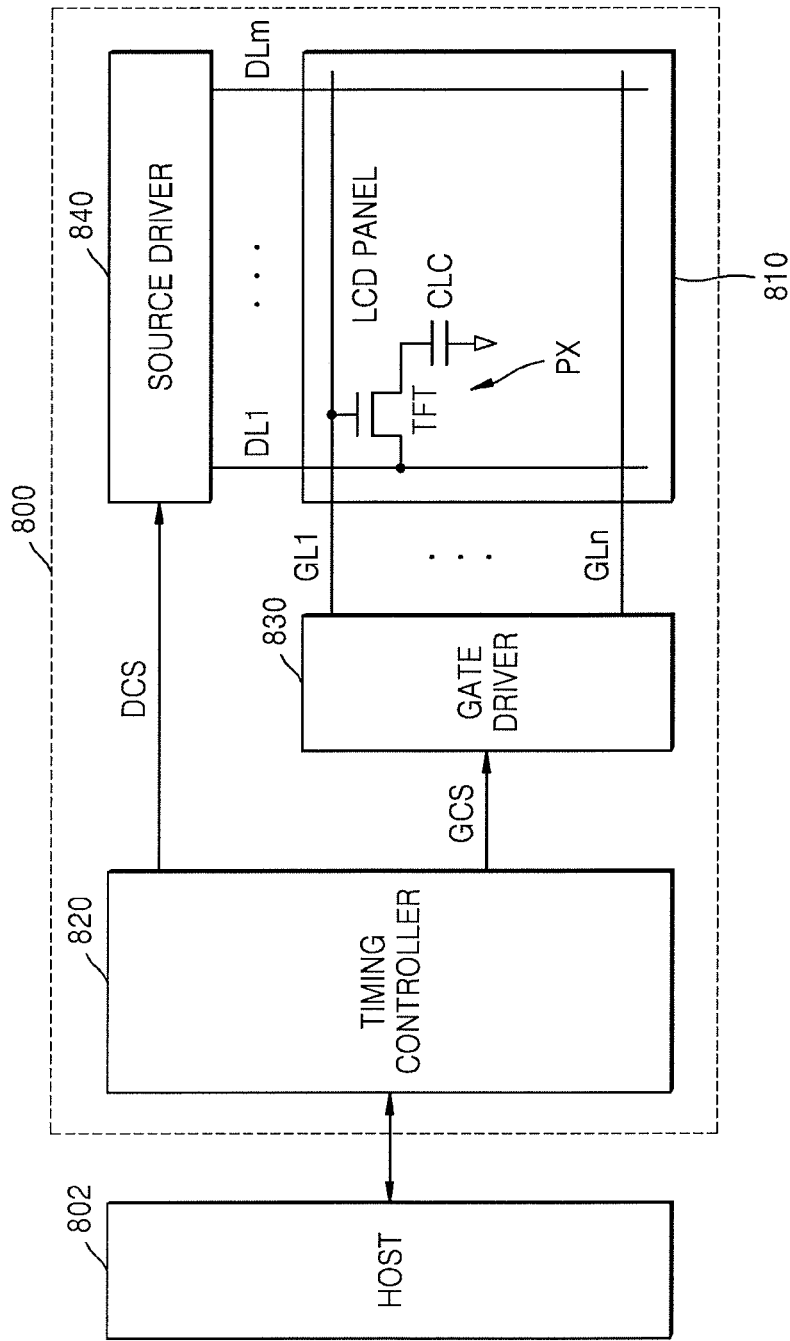
FIG. 14 illustrates a block diagram of a display device according to an example embodiment.

FIG. 14 illustrates a block diagram of a display device 800 according to an example embodiment.

Referring to FIG. 14, the display device 800 may include an LC panel 810, a timing controller 820, a gate driver 830, and a source driver 840.

The LC panel 810 may include a plurality of gate lines GL1, . . . , and GLn, a plurality of data lines DL1, . . . , and DLm, and a plurality of pixels PX that are arranged in a matrix shape and defined by intersection between a plurality of gate lines GL1, . . . , and GLn and a plurality of data lines DL1, . . . , and DLm.

The plurality of pixels PX may have the same configuration and provide the same function. Only one pixel PX is illustrated in FIG. 14 for brevity. Each of the plurality of pixels PX may include a thin-film transistor TFT and an LC capacitor CLC. A gate electrode of the thin-film transistor TFT may be connected to the corresponding gate line. A source electrode of the thin-film transistor TFT may be connected to the corresponding data line. The LC capacitor CLC may be connected a drain electrode of the thin-film transistor TFT.

The timing controller 820 may receive external signals from a host 802. The external signals may include an image signal and a reference signal. The reference signal may be a signal (e.g., a vertical synchronous signal or a horizontal synchronous signal) that is synchronized with a frame frequency. The timing controller 820 may convert an input external signal and generate a gate control signal GCS and a data control signal DCS.

The timing controller 820 may output the generated gate control signal GCS to the gate driver 830. Also, the timing controller 820 may output the generated data control signal DCS to the source driver 840. The timing controller 820 may control the gate driver 830 and the source driver 840 in response to the gate control signal GCS and the data control signal DCS.

The gate driver 830 may sequentially apply a gate signal to the plurality of gate lines GL1, . . . , and GLn of the LC panel 810 in response to the gate control signal GCS generated by the timing controller 820.

The source driver 840 may apply a data signal to the plurality of data lines DL1, . . . , and DLm of the LC panel 810 in response to the data control signal DCS generated by the timing controller 820.

When the gate signal is sequentially applied from the gate driver 830 to the plurality of gate lines GL1, . . . , and GLn, a data corresponding to the gate line to which the gate signal is applied may be applied from the source driver 840 to the plurality of data lines DL1, . . . , and DLm in synchronization with the gate signal.

By applying a gate signal to the plurality of gate lines GL1, . . . , and GLn for one frame, an image of one frame may be displayed. When a gate signal is applied to one (e.g., the gate line GL1) selected from the plurality of gate lines GL1, . . . , and GLn, a thin-film transistor (TFT) connected to the gate line GL1 may be turned on in response to the applied gate signal. When a data signal is applied to a data line DL1 to which the turned-on TFT is connected, the applied data signal may be applied through the turned-on TFT and charged in the LC capacitor CLC. As the TFT is repetitively turned on and off, the data signal may be charged in and discharged from the LC capacitor CLC. A light transmittance of LCs may be adjusted in response to a voltage charged in the LC capacitor CLC so that the LC panel 810 may operate.

In some embodiments, each of the plurality of pixels PX of the LC panel 810 may be formed using an exposure process using the photomask 100 shown in FIGS. 1A and 1B or an exposure process using the photomask 200 shown in FIGS. 2A and 2B. In some embodiments, each of the plurality of pixels PX of the LC panel 810 may be manufactured using the method of manufacturing the electronic device as described with reference to FIGS. 4 and 5 or the method f manufacturing the display device as described with reference to FIGS. 6 and 7.

By way of summation and review, in fabricating high-resolution display devices, the line width of pixel transistors has gradually been reduced in manufacture of a thin-film transistor liquid crystal display (TFT LCD). In a lithography process for manufacturing an electronic device, such as a display device, light may be irradiated to a photomask so that a pattern formed on the photomask may be transferred to a photoresist layer formed on a display panel. In the manufacture of the display device, the influence of a lithography process for forming a TFT array upon mass productivity of the display device has gradually increased.

A large-area transparent substrate may be used as a transparent substrate for forming a TFT array to promote mass production. To expose the large-area transparent substrate, it is possible to use a proximity optical projecting system configured to divide the transparent substrate into a plurality of exposure regions and sequentially expose the divided exposure regions of the transparent substrate. Generally, a photomask includes a blind region, which is formed in an edge region of the photomask and includes a light shielding layer, to prevent the divided exposure regions from being duplicatively exposed. However, since the light shielding layer is used for a process of forming the photomask, time and costs required for the process of forming the photomask may increase. Also, with miniaturization of a line width required by a pixel transistor of a display device, a phase shift mask (PSM) may be used to form a fine pattern having a critical dimension (CD) of about 2 μm or less in a pattern region. In the manufacture of the PSM, when the light shielding layer is used to form a blind region, not only time taken to remove the unnecessary light shielding layer from the pattern region but also the likelihood of occurrence of defects may increase, thereby degrading efficiency of manufacture of the photomask.

As described above, embodiments relate to a photomask, which is free from a light shielding layer, a method of manufacturing the photomask, a method of manufacturing an electronic device using a photomask that is free from a light shielding layer, and a method of manufacturing a display device.

Embodiments may provide a photomask that has a pattern region with a downscaled line width and is free from a light shielding layer. Since the photomask does not include the light shielding layer, the likelihood of occurrence of defects due to the use of the light shielding layer may be removed, and the photomask may have a simple structure formed by using a simple process.

Also, embodiments may provide a method of manufacturing a photomask without using a light shielding layer, by which the likelihood of occurrence of defects may be reduced during a process of manufacturing the photomask and the process of manufacturing the photomask may be simplified.

In addition, embodiments may provide a method of manufacturing an electronic device, by which downscaled patterns may be effectively transferred to a large-area substrate using a photomask that is free from a light shielding layer.

Furthermore, embodiments may provide a method of manufacturing a display device, by which downscaled patterns may be effectively transferred to a large-area substrate using a photomask that is free from a light shielding layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A phase shift mask, comprising:
a substrate;
a second phase shift pattern on the substrate, the second phase shift pattern extending to an outermost perimeter of the substrate, the second phase shift pattern being formed of a material that is semi-transmissive to light of a first wavelength, and the substrate being substantially transparent to the light of the first wavelength, such that the mask transmits about 2 to about 10% of the light of the first wavelength at the second phase shift pattern;
a first phase shift pattern on the substrate, the second phase shift pattern being disposed between the outermost perimeter of the substrate and the first phase shift pattern; and
an open area between the first and second phase shift patterns in which no phase shift pattern is disposed, the open area continuously surrounding the first phase shift pattern.

2. The phase shift mask as claimed in claim 1, wherein the second phase shift pattern has an opening therein, the opening corresponding to an alignment key.

3. The phase shift mask as claimed in claim 1, wherein a minimum transmittance of the entire area of the phase shift mask is about 2% with respect to the light of the first wavelength.

4. The phase shift mask as claimed in claim 1, wherein the phase shift mask does not include an opaque area.

5. A phase shift mask, comprising:
a substrate; and
a phase shift layer on the substrate, wherein an edge portion of the phase shift mask is a semitransparent region, wherein:
the phase shift mask includes a main pattern region and an open area,
the main pattern region has substantially the same thickness as the semitransparent region, and
the open area is an area in which no phase shift pattern is disposed, and continuously surrounds the main pattern region.

6. The phase shift mask as claimed in claim 5, wherein the semitransparent region transmits about 2 to 10% of light.

7. The phase shift mask as claimed in claim 6, wherein the phase shift layer includes one or more of chromium oxide or molybdenum silicide.

8. The phase shift mask as claimed in claim 5, wherein the phase shift mask does not include an opaque layer at the edge portion, the edge portion being an outer edge of the phase shift mask.

9. The phase shift mask as claimed in claim 5, wherein the semitransparent region is disposed between the main pattern region and an outermost edge of the phase shift mask.

* * * * *